US008614545B2

(12) United States Patent
Miyashita et al.

(10) Patent No.: US 8,614,545 B2
(45) Date of Patent: Dec. 24, 2013

(54) ORGANIC EL DISPLAY DEVICE HAVING A BANK FORMED TO FILL SPACES BETWEEN PIXEL ELECTRODES

(75) Inventors: Satoru Miyashita, Suwa (JP); Hiroshi Kiguchi, Suwa (JP); Tatsuya Shimoda, Suwa (JP); Sadao Kanbe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 12/651,267

(22) Filed: Dec. 31, 2009

(65) Prior Publication Data

US 2010/0120185 A1 May 13, 2010

Related U.S. Application Data

(60) Division of application No. 10/956,123, filed on Oct. 4, 2004, now Pat. No. 7,662,425, which is a division of application No. 10/166,704, filed on Jun. 12, 2002, now Pat. No. 6,821,553, which is a continuation of application No. 09/101,083, filed as application No. PCT/JP97/04283 on Nov. 25, 1997, now Pat. No. 6,863,961.

(30) Foreign Application Priority Data

Nov. 25, 1996 (JP) ..................................... 8-313828

(51) Int. Cl.
*H01L 51/50* (2006.01)
(52) U.S. Cl.
USPC .......................................... 313/504; 313/506
(58) Field of Classification Search
None
See application file for complete search history.

(56) References Cited

U.S. PATENT DOCUMENTS

| 3,792,308 | A |   | 2/1974 | Ota |
|---|---|---|---|---|
| 3,956,032 | A |   | 5/1976 | Powell et al. |
| 4,007,462 | A |   | 2/1977 | Wetsel, Jr. |
| 4,015,166 | A | * | 3/1977 | Ohshima et al. ............... 313/503 |
| 4,569,305 | A |   | 2/1986 | Ferri et al. |
| 4,683,146 | A |   | 7/1987 | Hirai et al. |
| 4,687,352 | A |   | 8/1987 | Igi et al. |
| 4,757,235 | A | * | 7/1988 | Nunomura et al. ........... 313/506 |
| 4,792,817 | A |   | 12/1988 | Barney |
| 4,891,110 | A |   | 1/1990 | Libman et al. |
| 4,983,880 | A | * | 1/1991 | Abdalla et al. ................ 313/506 |

(Continued)

FOREIGN PATENT DOCUMENTS

| DE | 42 12 501 C1 | 8/1993 |
|---|---|---|
| DE | 196 03 451 A1 | 8/1996 |

(Continued)

OTHER PUBLICATIONS

U.S. Appl. No. 09/901,095, filed Jul. 10, 2001, Kimura et al.

(Continued)

*Primary Examiner* — Britt D Hanley
(74) *Attorney, Agent, or Firm* — Oliff & Berridge, PLC

(57) ABSTRACT

A method of manufacturing an organic EL element according to the present invention comprises the steps of forming pixel electrodes (801), (802), (803) on a transparent substrate' (804) and forming on the pixel electrodes by patterning luminescent layers (806), (807), (808) made of an organic compound by means of an ink-jet method. According to this method, it is possible to carry out a high precise patterning easily and in a short time, thereby enabling to carry out optimization for a film design and luminescent characteristic easily as well as making it easy to adjust a luminous efficiency.

8 Claims, 15 Drawing Sheets

(56) References Cited

U.S. PATENT DOCUMENTS

| | | |
|---|---|---|
| 5,041,190 A | 8/1991 | Drake et al. |
| 5,132,248 A | 7/1992 | Drummond et al. |
| 5,202,261 A | 4/1993 | Musho et al. |
| 5,214,350 A | 5/1993 | Remec et al. |
| 5,250,439 A | 10/1993 | Musho et al. |
| 5,274,481 A | 12/1993 | Kim |
| 5,276,380 A | 1/1994 | Tang |
| 5,281,450 A | 1/1994 | Yaniv |
| 5,281,489 A | 1/1994 | Mori et al. |
| 5,317,169 A | 5/1994 | Nakano et al. |
| 5,326,692 A | 7/1994 | Brinkley et al. |
| 5,363,800 A | 11/1994 | Larkin et al. |
| 5,399,390 A | 3/1995 | Akins |
| 5,424,560 A | 6/1995 | Norman et al. |
| 5,438,241 A | 8/1995 | Zavracky et al. |
| 5,439,519 A | 8/1995 | Sago et al. |
| 5,472,889 A | 12/1995 | Kim et al. |
| 5,477,352 A | 12/1995 | Hirai et al. |
| 5,510,066 A | 4/1996 | Fink et al. |
| 5,525,434 A | 6/1996 | Nashimoto |
| 5,534,716 A | 7/1996 | Takemura |
| 5,540,999 A | 7/1996 | Yamamoto et al. |
| 5,558,946 A | 9/1996 | Nishimoto |
| 5,576,070 A | 11/1996 | Yaniv |
| 5,593,788 A | 1/1997 | Shi et al. |
| 5,610,932 A | 3/1997 | Kessler et al. |
| 5,645,901 A | 7/1997 | Fukuchi et al. |
| 5,652,019 A | 7/1997 | Moran |
| 5,652,067 A | 7/1997 | Ito et al. |
| 5,656,826 A | 8/1997 | Misawa et al. |
| 5,665,857 A | 9/1997 | Shi |
| 5,684,365 A * | 11/1997 | Tang et al. ............... 315/169.3 |
| 5,688,551 A * | 11/1997 | Littman et al. ............... 427/64 |
| 5,693,428 A | 12/1997 | Fujii et al. |
| 5,693,962 A | 12/1997 | Shi et al. |
| 5,707,745 A * | 1/1998 | Forrest et al. ............... 428/432 |
| 5,713,278 A | 2/1998 | Kawano et al. |
| 5,728,626 A | 3/1998 | Allman et al. |
| 5,742,129 A | 4/1998 | Nagayama et al. |
| 5,744,171 A | 4/1998 | Schneider |
| 5,757,453 A | 5/1998 | Shin et al. |
| 5,759,268 A | 6/1998 | Begin et al. |
| 5,770,260 A | 6/1998 | Fukuyama et al. |
| 5,771,562 A | 6/1998 | Harvey, III et al. |
| 5,779,799 A | 7/1998 | Davis |
| 5,784,132 A | 7/1998 | Hashimoto |
| 5,804,917 A * | 9/1998 | Takahashi et al. ............ 313/504 |
| 5,821,002 A | 10/1998 | Ohnishi et al. |
| 5,854,139 A | 12/1998 | Aratani et al. |
| 5,895,692 A | 4/1999 | Shirasaki et al. |
| 5,935,331 A | 8/1999 | Naka et al. |
| 5,972,419 A | 10/1999 | Roitman |
| 5,989,945 A | 11/1999 | Yudasaka et al. |
| 5,997,122 A | 12/1999 | Moriyama et al. |
| 6,008,828 A | 12/1999 | Furuki et al. |
| 6,013,982 A | 1/2000 | Thompson et al. |
| RE36,711 E | 5/2000 | Yaniv |
| 6,087,196 A | 7/2000 | Sturm et al. |
| 6,104,311 A | 8/2000 | Lastinger |
| 6,137,221 A | 10/2000 | Roitman et al. |
| 6,153,711 A | 11/2000 | Towns et al. |
| 6,180,294 B1 | 1/2001 | Shiba et al. |
| 6,187,457 B1 | 2/2001 | Arai et al. |
| 6,195,142 B1 | 2/2001 | Gyotoku et al. |
| 6,337,222 B1 | 1/2002 | Shimoda et al. |
| 6,420,834 B2 * | 7/2002 | Yamazaki et al. ......... 315/169.3 |
| 6,515,310 B2 * | 2/2003 | Yamazaki et al. ............ 257/98 |
| 6,580,212 B2 | 6/2003 | Friend |
| 6,610,552 B2 | 8/2003 | Fujimori et al. |
| 6,696,785 B2 | 2/2004 | Shimoda et al. |
| 6,863,961 B2 | 3/2005 | Miyashita et al. |
| 2002/0011783 A1 | 1/2002 | Hosokawa |
| 2002/0163300 A1 | 11/2002 | Duineveld et al. |

FOREIGN PATENT DOCUMENTS

| | | |
|---|---|---|
| EP | 0 218 117 A2 | 4/1987 |
| EP | 0 404 545 A2 | 12/1990 |
| EP | 0 431 249 A2 | 6/1991 |
| EP | 0 486 318 A1 | 5/1992 |
| EP | 0 550 063 A2 | 7/1993 |
| EP | 0 589 049 A1 | 3/1994 |
| EP | 0 656 644 A1 | 6/1995 |
| EP | 0 665 449 A1 | 8/1995 |
| EP | 0 717 439 A2 | 6/1996 |
| EP | 0 732 868 A1 | 9/1996 |
| EP | 0 756 932 A2 | 2/1997 |
| JP | A-59-075205 | 4/1984 |
| JP | A-61-078165 | 4/1986 |
| JP | A-62-031174 | 2/1987 |
| JP | A-62-085224 | 4/1987 |
| JP | A-62-223727 | 10/1987 |
| JP | A-62-295028 | 12/1987 |
| JP | A-63-015527 | 1/1988 |
| JP | A-01-140188 | 6/1989 |
| JP | A-03-033824 | 2/1991 |
| JP | A-03-102324 | 4/1991 |
| JP | A-03-126921 | 5/1991 |
| JP | A-03-168613 | 7/1991 |
| JP | A-03-192334 | 8/1991 |
| JP | A-03-250583 | 11/1991 |
| JP | A-03-269995 | 12/1991 |
| JP | A-04-125683 | 4/1992 |
| JP | A-04-253033 | 9/1992 |
| JP | A-05-105486 | 4/1993 |
| JP | A-05-116941 | 5/1993 |
| JP | A-05-258860 | 10/1993 |
| JP | A-05-283166 | 10/1993 |
| JP | B2-05-078655 | 10/1993 |
| JP | A-05-297407 | 11/1993 |
| JP | A-06-033048 | 2/1994 |
| JP | A-06-186416 | 7/1994 |
| JP | A-06-204168 | 7/1994 |
| JP | A-06-281917 | 10/1994 |
| JP | A-06-281958 | 10/1994 |
| JP | A-06-308312 | 11/1994 |
| JP | A-06-325869 | 11/1994 |
| JP | A-07-057871 | 3/1995 |
| JP | A-07-101068 | 4/1995 |
| JP | A-07-122475 | 5/1995 |
| JP | A-07-134288 | 5/1995 |
| JP | A-07-153574 | 6/1995 |
| JP | A-07-169567 | 7/1995 |
| JP | A-07-192867 | 7/1995 |
| JP | A-07-220761 | 8/1995 |
| JP | A-07-235378 | 9/1995 |
| JP | A-07-509339 | 10/1995 |
| JP | A-07-294916 | 11/1995 |
| JP | A-08-001065 | 1/1996 |
| JP | A-08-032085 | 2/1996 |
| JP | A-08-064862 | 3/1996 |
| JP | A-08-188658 | 7/1996 |
| JP | A-08-188663 | 7/1996 |
| JP | A-08-213172 | 8/1996 |
| JP | A-08-227276 | 9/1996 |
| JP | A-08-264828 | 10/1996 |
| JP | A-09-167684 | 6/1997 |
| JP | A-10-012377 | 1/1998 |
| JP | A-10-055888 | 2/1998 |
| JP | A-10-112389 | 4/1998 |
| JP | A-10-153967 | 6/1998 |
| JP | A-2004-006393 | 1/2004 |
| JP | A-2004-006394 | 1/2004 |
| WO | WO 90/13148 A1 | 11/1990 |
| WO | WO 94/03031 A1 | 2/1994 |
| WO | WO 95/01871 A1 | 1/1995 |
| WO | WO 95/03031 A1 | 2/1995 |
| WO | WO 98/32783 A1 | 7/1998 |
| WO | WO 02/18513 A1 | 3/2002 |

OTHER PUBLICATIONS

U.S. Appl. No. 09/901,096, filed Jul. 10, 2001, Kiguchi et al.
U.S. Appl. No. 09/901,126, filed Jul. 10, 2001, Yudasaka et al.

(56) References Cited

OTHER PUBLICATIONS

Adachi et al. "Electroluminescent Device of Organic Thin Films," IEICE Technical Report, vol. 89, No. 106, 1989, pp. 49-50.
Adachi et al., "Blue light-emitting organic electroluminescent devices," Appl. Phys. Lett., vol. 56, No. 9, Feb. 26, 1990, pp. 799-801.
Budavari et al., The Merck Index: An Encyclopedia of Chemicals, Drugs, and Biologicals, Twelfth Edition, 1996, p. 357.
Burrows et al., "Color-tunable organic light-emitting devices," Appl. Phys. Lett., vol. 69, No. 20, Nov. 11, 1996, pp. 2959-2961.
Ebisawa et al., "Electrical properties of polyacetylene/polysiloxane interface," J. Appl. Phys., vol. 54, No. 6, Jun. 1983, pp. 3255-3259.
Friend et al., "Electroluminescence in conjugated polymers," Nature, vol. 397, Jan. 14, 1999, pp. 121-128.
Hebner et al., "Ink-jet printing of doped polymers for organic light emitting devices," Appl. Phys. Lett., vol. 72, No. 5, Feb. 2, 1998, pp. 519-521.
Hosokawa et al., "Highly efficient blue electroluminescence from a distyrylarylene emitting layer with a new dopant," Appl. Phys. Lett., vol. 67, No. 26, Dec. 25, 1995, pp. 3853-3855.
Ishimaru et al., "Development of Color Filters by Pigment Ink Jet Printing (II) (-Production Technology-)," SID, 1997, pp. 69-72.
Johnson ct al., "Electroluminescence from single layer molecularly doped polymer films", Pure & Appl. Chem., vol. 67, No. 1, 1995, pp. 175-182.
Kido et al., "Single-layer white light-emitting organic electroluminescent devices based on dye-dispersed poly(N-vinylcarbazole)," Appl. Phys. Lett., vol. 67, No. 16, Oct. 16, 1995, pp. 2281-2283.
Kido et al., "White light-emitting organic electroluminescent devices using the poly (N-vinylcarbazole) emitter layer doped with three fluorescent dyes," Appl. Phys. Lett., vol. 64, No. 7, Feb. 1994, pp. 815-817.
Kido et al., "Organic electroluminescent devices based on molecularly doped polymers," Appl. Phys. Lett., vol. 61, No. 7, Aug. 17, 1992, pp. 761-763.
Kim et al., "Challenges to Am-oled Technology for Mobile Display," IDW/AD '05, AMD6-1, pp. 267-270.
Lewis, Hawley's Condensed Chemical Dictionary, Thirteenth Edition, 1997, pp. 820 & 900-901.
Marsells et al. "Regiochemical Consequences in Poly(2,5-Pyridinium Vinylene): Kekule' and Non-Kekule' Conductive Polymers," Polymer Preprints, vol. 33, No. 1, Apr. 1992, pp. 1196-1197.
Mayo et al., "16.3: Colour Filters for Flat Panel Displays by High Definition Ink Jet Printing," Euro Display '96, Oct. 1-3, 1996, pp. 537-540.
Mitschke et al., "The electroluminescence of organic materials," Journal of Materials Chemistry, vol. 10, 2000, pp. 1471-1507.
Morrison et al., Organic Chemistry, Fifth Edition, 1987, p. 637.
Nonaka et al., "Development of Color Filters by Pigment Ink Jet Printing (I) (Fundamental Technology)," SID, 1997, pp. 238-241.
Parker et al., "Efficient blue electroluminescence from a fluorinated polyquinoline," Appl. Phys. Lett., vol. 65, No. 10, Sep. 5, 1994, pp. 1272-1274.
Reinig, "Fabrication of Organic Light-Emitting Devices," Physics REU: IA State University, Summer 2001.
Tian et al., "Electroluminescent Properties of Self-Assembled Polymer Thin Films," Adv. Mater., vol. 7, No. 4, 1995, pp. 395-398.
Tian et al., "Luminescent Properties of Conjugated Poly(p-pyridylvinylene) and Poly(p-pyridiniumvinylene)," Polymer Preprints, vol. 35, No. 2, Aug. 1994, pp. 761-762.
Tian et al., "Photophysical Properties, Self-Assembled Thin Films, and Light-Emitting Diodes of Poly(p-pyridylvinylene)s and Poly(p-pyridinium vinylene)s," Chem. Mater., vol. 7, No. 11, 1995, pp. 2190-2198.
Uchida et al., "Color-Variable Light-Emitting Diode Utilizing Conducting Polymer Containing Fluorescent Dye," Jpn. J. Appl. Phys., vol. 32, pp. L921-L924.
Van Slyke et al., "Organic electroluminescent devices with improved stability," Appl. Phys. Lett., vol. 69, No. 15, Oct. 7, 1996, pp. 2160-2162.
Vestweber et al., "Electroluminescence from polymer blends and molecularly doped polymers," Synthetic Metals, vol. 64, 1994, pp. 141-145.
Vissenberg, "Opto-Electronic Properties of Disordered Organic Semiconductors," Proefschrift, 1972.
Weast, CRC Handbook of Chemistry and Physics: A Ready-Reference Book of Chemical and Physical Data, 1989, pp. E106-E107.
Wu et al., "Efficient Organic Electroluminescent Devices Using Single-Layer Doped Polymer Thin Films with Bipolar Carrier Transport Abilities," IEEE Transactions on Electron Devices, vol. 44, No. 8, Aug. 1997, pp. 1269-1281.
Wu et al., "Integrated three-color organic light-emitting devices," Appl. Phys. Lett., vol. 69, No. 21, Nov. 18, 1996, pp. 3117-3119.
Wu et al., "Surface modification of indium tin oxide by plasma treatment: An effective method to improve the efficiency, brightness, and reliability of organic light emitting devices," Appl. Phys. Lett., vol. 70, No. 11, Mar. 17, 1997, pp. 1348-1350.
Yinkui et al., "Electroluminescent devices based on organic conjugated polymer," National University of Defense Technology, 1996, pp. 9-13.
Zhang et al., "Blue electroluminscent diodes utilizing blends of poly(p-phenylphenylene vinylene) in poly(9-vinylcarbazole)," Synthetic Metals, vol. 62, 1994, pp. 35-40.
Zhang et al., "Blue emission from polymer light-emitting diodes using non-conjugated polymer blends with air-stable electrodes," Synthetic Metals, vol. 72, Issue 2, May 1995, pp. 185-188.
Bao et al., "Organic Semiconductors for Plastic Electronics," IEEE Workshop on New and Emerging Technologies, 2001.
Tsumura et al., "Macromolecular electronic device: Field-effect transistor with a polythiophene thin film," Applied Physics Letters, vol. 49, No. 18, Nov. 3, 1986. (Abstract Only).
Mar. 5, 2002 Office Action issued in U.S. Appl. No. 09/731,915.
Nov. 19, 2002 Office Action issued in U.S. Appl. No. 09/731,915.
Mar. 10, 2003 Office Action issued in U.S. Appl. No. 09/731,915.
Aug. 25, 2003 Office Action issued in U.S. Appl. No. 09/731,915.
Apr. 22, 2004 Office Action issued in U.S. Appl. No. 09/731,915.
Aug. 11, 2004 Notice of Allowance issued in U.S. Appl. No. 09/731,915.
Nov. 20, 2002 Office Action issued in U.S. Appl. No. 09/901,097.
Apr. 7, 2003 Interview Summary issued in U.S. Appl. No. 09/901,097.
Oct. 24, 2003 Office Action issued in U.S. Appl. No. 09/901,097.
Oct. 28, 2004 Office Action issued in U.S. Appl. No. 09/901,097.
Mar. 10, 2005 Advisory Action issued in U.S. Appl. No. 09/901,097.
Jul. 12, 2005 Office Action issued in U.S. Appl. No. 09/901,097.
Feb. 28, 2006 Office Action issued in U.S. Appl. No. 09/901,097.
Jun. 13, 2002 Interview Summary issued in U.S. Appl. No. 09/983,414.
Jan. 15, 2002 Office Action issued in U.S. Appl. No. 09/983,414.
Aug. 20, 2002 Office Action issued in U.S. Appl. No. 09/983,414.
Apr. 9, 2003 Office Action issued in U.S. Appl. No. 09/983,414.
Sep. 25, 2003 Office Action issued in U.S. Appl. No. 09/983,414.
Mar. 19, 2004 Notice of Allowance issued in U.S. Appl. No. 09/983,414.

* cited by examiner

ORGANIC EL DISPLAY DEVICE HAVING A BANK FORMED TO FILL SPACES BETWEEN PIXEL ELECTRODES

This is a Division of U.S. patent application Ser. No. 10/956,123, filed Oct. 4, 2004, which in turn is a Division of U.S. patent application Ser. No. 10/166,704, filed Jun. 12, 2002, now U.S. Pat. No. 6,821,553, which in turn is a Continuation of U.S. patent application Ser. No. 09/101,083, filed Jul. 8, 1998, now U.S. Pat. No. 6,863,961, which in turn is a U.S. National Phase of PCT/JP97/04283, filed Nov. 25, 1997. The disclosures of the prior applications are hereby incorporated by reference herein in their entirety.

FIELD OF THE INVENTION

The present invention relates to a method of manufacturing an organic electroluminescent (EL) element, an organic EL element, and an organic EL display device.

BACKGROUND ART

An organic EL element is an element which has a configuration in which a thin film containing a fluorescent organic compound is held between a cathode and an anode. In the organic EL element, electrons and holes are injected from the respective electrodes into the thin film to generate excitons through the recombination of the electrons and holes. The organic EL element produces luminescence by utilizing emission of light (fluorescence or phosphorescence) at the deactivation of the excitons.

The features of the organic EL element is that it is possible to obtain a high intensity surface luminescence on the order of 100 to 100,000 $cd/m^2$ at a low voltage of less than 10V, and that it is possible to produce luminescence of from blue to red y the selection of the kind of fluorescent material.

The organic EL element is drawing attraction as a device for realizing a large area full color display element at a low cost (see, Institute of Electronics, Information and Communication Engineers (IEICE) Technical Report, Vol. 89, No. 106, 1989, p. 49). According to the report, bright luminescence of blue, green and red were obtained by forming a luminescent layer using an organic luminescent material which emits strong fluorescence. This fact is considered to mean that it is possible to realize a high brightness full color display by using an organic coloring matter which emits strong fluorescence in a thin film state and has less pin hole defects.

In addition, in Japanese Laid-Open Publication No. Hei 5-78655, there is proposed to use an organic luminescent layer containing a luminescent material which is formed of a mixture of an organic charging material and an organic luminescent material, thereby obtaining a high brightness full color element by preventing quenching due to higher concentration as well as expanding the latitude in the selection of the luminescent material.

Further, in Appl. Phys. Lett. Vol. 64, 1994, p. 815, it is reported that a white luminescence was obtained by using polyvinyl carbazole (PVK) as a luminescent material and doping it with coloring matters corresponding to three primary colors R, G and B. However, in neither of the above references, the configuration or the method of manufacture of an actual full color display panel is not shown.

In the organic thin film EL elements using the organic luminescent materials described above, in order to realize a full color display device, it is necessary to arrange organic luminescent layers which emit any one of the three primary colors for the respective pixels. However, there is a problem in that a polymer or precursor that forms the organic luminescent layer lacks a sufficient resistance to a patterning process such as photolithography, so that it is very difficult to carry out patterning with highly precision.

Further, when several organic layers are to be formed by a vacuum deposition method, it takes a long time. Therefore, such a method cannot be said to be an efficient method of manufacturing the element.

SUMMARY OF THE INVENTION

It is an object of the present invention to provide a method of manufacturing an organic EL element which makes it possible to carry out patterning easily and precisely, can attain optimization of a film design in a simple manner, and has excellent luminescence characteristics, as well as to provide an organic EL element and an organic EL display device.

In order to achieve the above object, the manufacturing method of an organic EL element according to the present invention comprises the steps of forming pixel electrodes on a transparent substrate, forming on the pixel electrodes by patterning at least one luminescent layer having a certain color and made of an organic compound, and forming a counter electrode opposing the pixel electrodes, wherein the formation of the luminescent layers is performed by means of an ink-jet method.

In the present invention, it is preferable that the organic compound is a polymer organic compound. In this case, it is preferable that the polymer organic compound is a hole injection and transfer type material. Preferably, such a polymer organic compound is a polyparaphenylene vinylene or its derivative or a copolymer which contains at least either one of these compounds.

In this connection, when an organic luminescent material itself is not a hole injection and transfer type material, as is the case in the above-mentioned polymer organic compound, it is possible to add a hole injection and transfer type material to the luminescent layer in addition to the luminescent material.

Further, it is also preferred that the at least one luminescent layer comprises three layers having different colors, in which the at least two colors out of the luminescent layers of three colors are patterned by means of an ink-jet method. The three colors are red, green and blue, and it is preferable that the red luminescent layer and the green luminescent layer are patterned by means of an ink-jet method. In this case, it is more preferable that the blue luminescent layer is formed by a vacuum deposition method. Further, it is preferable that the blue luminescent layer is made of an electron injection and transfer type material, such as an aluminum quinolinol complex.

In the manufacturing method for the organic EL element according to the present invention, it is preferable that at least one luminescent layer is laminated with a hole injection and transfer layer, and it is also preferable that a protective film is formed on the counter electrode.

In the manufacturing method for the organic EL element of the present invention, it is preferable that the transparent substrate is provided with thin film transistors for driving respective pixels.

Further, it is preferable that the pixel electrodes are formed into a transparent pixel electrode.

Furthermore, the organic EL element of the present invention is provided with a transparent substrate, pixel electrodes formed on the transparent substrate, at least one luminescent layers having a certain color and made of an organic compound, the luminescent layer being patterned on the pixel electrodes by an ink-jet method, and a counter electrode formed on the luminescent layer.

It is preferable that the organic compound is a polymer organic compound, and it is more preferable that the polymer organic compound is a hole injection and transfer type material.

Moreover, it is preferable that the polymer organic compound is a polyparaphenylene vinylene or its derivative or a copolymer containing at least one of them.

It is preferred that the at least luminescent layer includes three layers having different three colors, and it is preferable that two layers thereof in the luminescent layers of three colors are patterned by an ink-jet method. The three colors are red, green and blue, and it is more preferable that the red luminescent layer and the green luminescent layer are separately patterned by an ink-jet method. In this case, it is more preferable that the blue luminescent layer is formed by a vacuum deposition method.

It is preferable that the blue luminescent layer is made of an electron injection and transfer material. As for such a blue luminescent layer, a layer containing an aluminum quinolynol complex can be mentioned.

Moreover, it is preferable that at least one luminescent layer is laminated with a hole injection and transfer type layer, and it is more preferable that a protective film is formed on the cathode.

Furthermore, it is preferable that the pixel electrodes are formed into a transparent pixel electrode.

Moreover, the organic EL display device according to the present invention is characterized in that it includes the organic EL element described in the above.

PREFERRED EMBODIMENTS OF THE INVENTION

In the following, the manufacturing method of the organic EL element and the organic EL element according to the present invention will be described in detail based on the preferred embodiments shown in the accompanying drawings.

Figure 1:
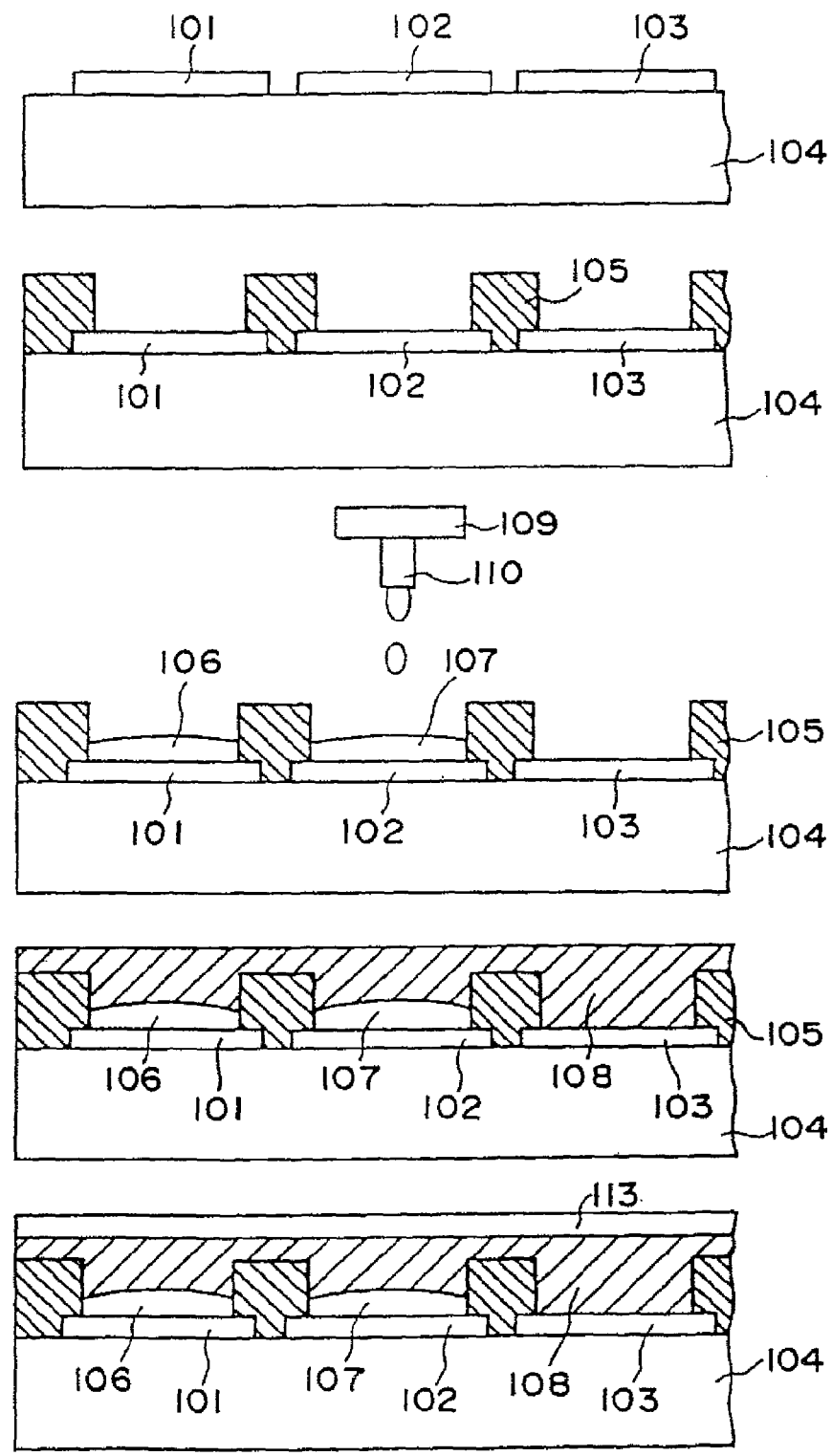
FIG. 1 is a sectional view which shows a first embodiment of a manufacturing method for an organic EL element according to the present invention.

FIG. 1 shows a first embodiment of the manufacturing method of the organic EL element according to the present invention. This figure shows the manufacturing method of a full color organic EL element with three colors. As shown in the figure, this invention is directed to a method of manufacturing an organic EL element which comprises a step of forming pixel electrodes 101, 102 and 103 on a transparent substrate (transparent support) 104, a step of patterning luminescent layers 106 and 107 which are made of organic compounds on the respective pixel electrodes, and a step of forming a cathode 113, wherein the method is characterized in that the formation of the luminescent layers is carried out by means of an ink-jet method.

The transparent substrate 104 functions not only as a support but also as a surface through which light is taken out. Accordingly, the material for the transparent substrate 104 is selected by taking the light-permeability, thermal stability and the like into consideration. As for examples of the material to be used for the transparent substrate, glass, transparent plastic or the like can be mentioned, and among these materials, a substrate made of glass is particularly preferable in view of its excellent heat resistance.

In more details, the first, pixel electrodes 101, 102 and 103 are formed on the transparent substrate 104. As for examples of methods of forming these pixel electrodes, photolithography, vacuum deposition method, sputtering method and pyrosol method can be mentioned. Among these methods the photolithography is particularly preferable. As for these pixel electrodes, it is preferred that they are formed into transparent pixel electrodes. As for the materials constituting the transparent pixel electrodes, a tin oxide film, an ITO (indium tin oxide) film and a composite oxide film of indium oxide and zinc oxide can be mentioned.

Next, partitioning walls (banks) 105 are formed to fill the spaces between the pixel electrodes.

In this way, it is possible to improve the contrast, to prevent mixing of colors of the luminescent materials, and to prevent light from leaking between the pixels.

As for the materials constituting the banks 105, no particular limitation is imposed, if they have a resistance to the solvent for the EL material. For example, organic material such as acrylic resin, epoxy resin, photosensitive polyimide and the like; and inorganic material such as liquid glass and the like can be mentioned. In this regard, it is to be noted that the banks 105 may be formed into a black resist which is formed by mixing carbon black and the like into the above-mentioned material.

As for examples of the forming method for the banks 105, photolithography and the like can be mentioned.

Further, organic luminescent layers are formed respectively on the pixel electrodes according to a predetermined pattern. In this case, it is preferable to provide organic luminescent layers with three color types. In this connection, it is preferred that at least one layer among these organic luminescent layers is formed by an ink-jet method.

In the embodiment shown in FIG. 1, a red luminescent layer 106 and a green luminescent layer 107 are formed on the pixel electrodes 101 and 102, respectively, by the ink-jet method.

In the above descriptions, the term "ink-jet method" is used to mean a method of forming a pixel of one of the three primary colors including red, green and blue or a pixel of at least one color which is intermediate between the primary colors by dissolving or dispersing a luminescent material in a solvent to obtain a discharge liquid and then discharging the discharge liquid from a head 110 of an ink-jet device 109.

According to such an ink-jet method, it is possible to carry out fine patterning in a simple manner and in a short time. Further, it is also possible to control easily and freely the luminescent characteristics such as color balance and brightness (luminance) by adjusting the thickness of the layer through adjustment of the discharge amount of the ink or by adjusting the ink concentration.

When the organic luminescent materials are conjugated polymer precursors described later, the luminescent layers are formed by discharging the luminescent materials by the ink-jet method to carry out patterning, and then conjugating (to form a film) the precursor components by heating or irradiation with light or the like.

Next, as shown in FIG. 1, a blue luminescent layer 108 is formed on the red luminescent layer 106, the green luminescent layer 107 and the pixel electrode 103. In this way, it is possible not only to form layers having the three primary colors including red, green and blue, but also to bury the level differences between the banks 105 and each of the red luminescent layer 106 and the green luminescent layer 107 so as to be flattened.

No particular limitation is imposed upon the forming method for the blue luminescent layer 108, and it is possible to form the layer using the general film forming method known as deposition method or wet method, for instance, or using the ink-jet method.

Further, the blue luminescent layer 108 can be formed of an electron injection and transfer material such as aluminum quinolynol complex. In this case, it is possible to promote the injection and transfer of the carriers so as to improve the luminous efficiency. Furthermore, when such a blue luminescent layer 108 is laminated with red and green luminescent layers formed of a hole injection and transfer material described later, it is also possible to inject and transfer the electrons and the holes from the respective electrodes into these laminated luminescent layers with appropriate balance, thereby enabling to improve the luminous efficiency.

Moreover, when such a blue luminescent layer 108 is laminated with the red and green luminescent layers made of a hole injection and transfer type material, the function of hole injection and transfer and the function of electron injection and transfer can be assigned separately to different layers, so that optimum design can be selected for the respective materials. No particular limitation is imposed upon the forming method of such an electron injection and transfer layer, and it is possible to form the layer by using, for example, the general film forming method known as deposition method or wet method or the ink-jet method.

In this connection, as for an organic compound which can form an electron injection and transfer layer, oxadiazole derivative such as PBD, OXD-8 and the like, DSA, aluminum quinolinol complex, Bebq, triazole derivative, azomethine complex, porphine complex, benzoxadiazol and the like can be mentioned. In this case, an electron injection and transfer layer can be formed from just one of these materials, or formed by mixing or laminating one of or two or more of them. In addition, the electron injection and transfer layer may be formed by doping a fluorescence dye described later to the organic compound described. Further, the electron injection and transfer layer itself may have a function of luminescence.

As described above, in this embodiment, organic luminescent layers for two colors are formed by the ink-jet method while the layer for the remaining one color is formed by a different method. Therefore, according to this embodiment, even when a luminescent material which is not so suited for the ink-jet method is used, a full color organic EL element can be formed by using such a material in a combination with other organic luminescent materials that are suited for the ink-jet method, so that the latitude in the design for the EL element will be expanded.

As for examples of the forming method for the luminescent layer other than the ink-jet method, photolithography method, vacuum deposition method, printing method, transfer method, dipping method, spin coating method, casting method, capillary method, roll coating method, bar coating method and the like can be mentioned.

Finally, a cathode (a counter electrode) 113 is faulted, thereby the organic EL element of the present invention is completed. In this case, it is preferred that the cathode 113 is formed into a metallic thin film electrode, and as for examples of the metal for forming the cathode, Mg, Ag, Al, Li and the like can be mentioned. In addition, a material having small work function can be used for the material for the cathode 113, and for example, alkali metal, alkali earth metal such as Ca and the like, and alloys containing these metals can be used. Such a cathode 113 may be formed using a deposition method, a sputtering method or the like.

The organic EL element of the present invention is manufactured through the processes described in the above. Namely, as shown in FIG. 1, the pixel electrodes 101 and 102 are provided on the transparent substrate 104, the red luminescent layer 106 and the green luminescent layer 107 which are made of organic compounds are then formed on the pixel electrodes 101 and 102, respectively, by patterning by using the ink-jet method, and then the blue luminescent layer 108 is formed on the luminescent layers 106 and 107 and the pixel electrode 103 by the vacuum deposition method. Thereafter, the cathode 113 is faulted on top of the blue luminescent layer 108, thereby the organic EL element according to the present invention is completed.

Figure 6:
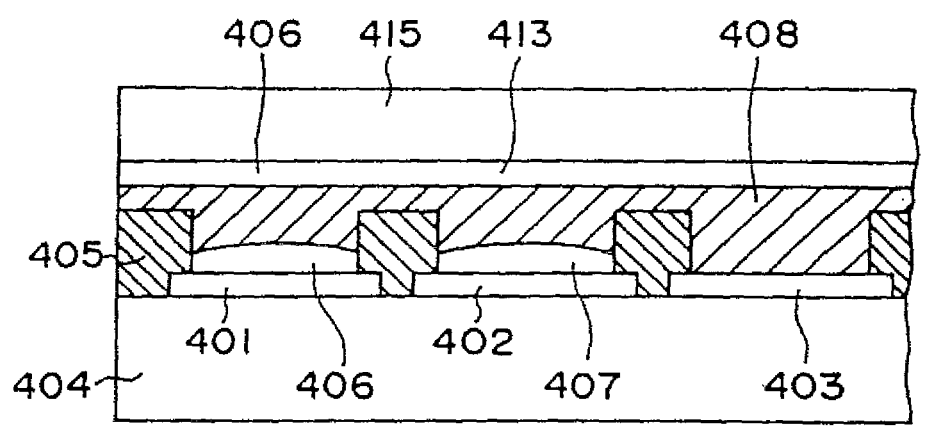
FIG. 6 is a sectional view which shows an example of the organic EL element according to the present invention.

Further, as shown in FIG. 6, a protective film 415 may be formed on top of a cathode 413. By forming such a protective film 415, it becomes possible to prevent deterioration, damage, peeling and the like from occurring in the cathode 413 and in the luminescent layers 406, 407 and 408.

As for materials for constructing the protective film 415, epoxy resin, acrylic resin, liquid glass, and the like can be mentioned. Further, as for examples of the forming method for the protective film 415, spin coating method, casting method, dipping method, bar coating method, roll coating method, capillary method and the like can be mentioned.

In this embodiment, it is preferable that these luminescent layers are formed of an organic compound, and it is more preferable that these luminescent layers are formed of a polymer organic compound. By providing such luminescent layers that are formed of the organic compound, it is possible to obtain high brightness surface luminescence at low voltages. Further, since luminescent materials can be selected from wide range of field, a rational design for the luminescent element becomes possible.

In particular, polymer organic compounds have an excellent film formation property, and the luminescent layers composed of polymer organic compounds have an extremely good durability. Further, these polymer organic compounds have a band gap in the visible region and a relatively high electrical conductivity. Among such polymer organic compounds, a conjugated polymer can exhibit such properties prominently.

As for materials for the organic luminescent layers, polymer organic compound itself, precursor of conjugated organic polymer compound which is to be conjugated (to form a film) by heating or the like, and other materials are used.

When a precursor prior to conjugation (to form a film) is used as a luminescent material, the viscosity or the like of a discharge liquid used for the ink-jet system can be adjusted easily, so that the patterning is carried out precisely and the luminescence characteristics and the film properties of the luminescent layer can be controlled easily.

It is preferred that the polymer organic compound forming the luminescent layers is a hole injection and transfer material. In this way, it is possible to promote the injection and transfer of the carriers and thereby to improve the luminous efficiency.

As for examples of an organic compound which can form the luminescent layers, polyalkylthiophene such as PPV (poly(para-phenylene vinylene)) or its derivative, PTV (poly(2,5-thienylene vinylene)) and the like; polyallylene vinylene such as PFV (poly(2,5-furylene vinylene)) polyparaphenylene, polyalkylfluorene and the like; pyrazoline dimer; quinolizine carboxylic acid; benzopyrylium perchlorate; benzopyranoquinolizine; rubrene; phenanthroline europium complex and the like can be mentioned. In this case, just one of them or a mixture of two or more of them can be selectively used.

Among these organic compounds, PPV which is a conjugated organic polymer compound or its derivative is preferable. The precursor prior to conjugation (to form a film) of PPV or its derivative is soluble to water or organic solvent, so that they are suitable for pattern formation by the ink-jet method. Further, it is possible to obtain a thin layer which has high optical quality and excellent durability, since it is a polymer. Furthermore, PPV or its derivative possesses a strong fluorescence, and since it is a conductive polymer in which π-electron of double bond is delocalized on the polymer chain, a thin film of PPV also functions as a hole injection and transfer layer, which makes it possible to obtain an organic EL element having high performance.

Furthermore, the composition for an organic EL element in a case where a polymer organic compound is used for the material for the luminescent layers may include at least one kind of fluorescent dye in it. By including such fluorescent dye way, it becomes possible to change the luminous property of the luminescent layer. Therefore, the addition of the fluorescent dye is effective as a means, for example, for improving the luminous efficiency of the luminescent layer or for changing the maximum wavelength of light absorption (emitted color) of the luminescent layers.

Namely, a fluorescent dye can be utilized not only as a material for the luminescent layers but also as a material for the coloring matter which has the luminescence function itself. For example, almost all of the energy of the excitons which are generated by the recombination of carriers on the molecules of a conjugated organic polymer compound such as PPV can be transferred onto the molecules of the fluorescent dye. In this case, the current quantum efficiency of the EL element is also increased, because the luminescence arises only from the molecules of the fluorescent dye which have a high fluorescence quantum efficiency. Accordingly, by the addition of a fluorescent dye into the composition for the organic EL element, the luminescence spectrum of the luminescent layer becomes at the same time the spectrum of the fluorescent dye, whereby this method becomes also an effective means for changing the emitted color.

In this connection, it should be noted that what is meant here by the current quantum efficiency is a scale for considering the luminescence performance according to the luminescence function, and it is defined by the following expression.

$$\pi_E = \text{energy of emitted photon/input electrical energy.}$$

The changes in the maximum wavelength of light absorption induced by the doping of a fluorescent dye make it possible, for example, to emit the three primary colors of red, green and blue, thereby enabling to obtain a full color display device.

Further, the doping of the fluorescent dye makes it possible to improve extremely the luminous efficiency of the EL element.

As for a fluorescent dye used for the red luminescent layer, laser dye DCM, rhodamine or a rhodamine derivative, perylene and the like can be used. These fluorescent dyes are soluble to solvents because they are low molecules, and have a high compatibility with PPV or the like, so that a luminescent layer with a good uniformity and good stability can be formed easily. As for examples of the rhodamine derivative fluorescent dyes, rhodamine B, rhodamine B base, rhodamine 6G, rhodamine 101 perchlorate can be mentioned. In this case, a mixture of two or more of them can be selectively used.

Further, as for a fluorescent dye used in the green luminescent layer, quinacridone, rubrene, DCJT and their derivatives can be mentioned. Since these fluorescent dyes are low molecules in the same manner as the fluorescent dyes to be used in the above-mentioned red luminescent layer, they are soluble to solvents and have a high compatibility with PPV or the like, so that the luminescent layer can be formed easily.

As for the fluorescent dye used in the blue luminescent layer, distyrylbiphenyl and its derivative can be mentioned. These fluorescent dyes are soluble to aqueous solutions in the same manner as the above-mentioned fluorescent dyes for the red luminescent layer, and have high compatibility with PPV or the like, so that the luminescent layer can be formed easily.

In addition, as for other fluorescent dyes that can be used in the blue luminescent layer, coumarin; and coumarin derivatives such as coumarin-1, coumarin-6, coumarin-7, coumarin 120, coumarin 138, coumarin 152, coumarin 153, coumarin 311, coumarin 314, coumarin 334, coumarin 337, coumarin 343 and the like can be mentioned.

Moreover, as for other luminescent materials that can be used in the blue luminescent layer, tetraphenylbutadiene (TPB) or TPB derivative, DPVBi and the like can be mentioned. Since these luminescent materials are also low molecules in the same manner as the fluorescent dyes for the red luminescent layer, they are soluble to solvents, and have high compatibility with PPV or the like, so that the luminescent layer can be formed easily.

These fluorescent dyes and luminescent materials as described above can be selectively used as a just one of them or as a mixture of two or more of them.

Figure 10:
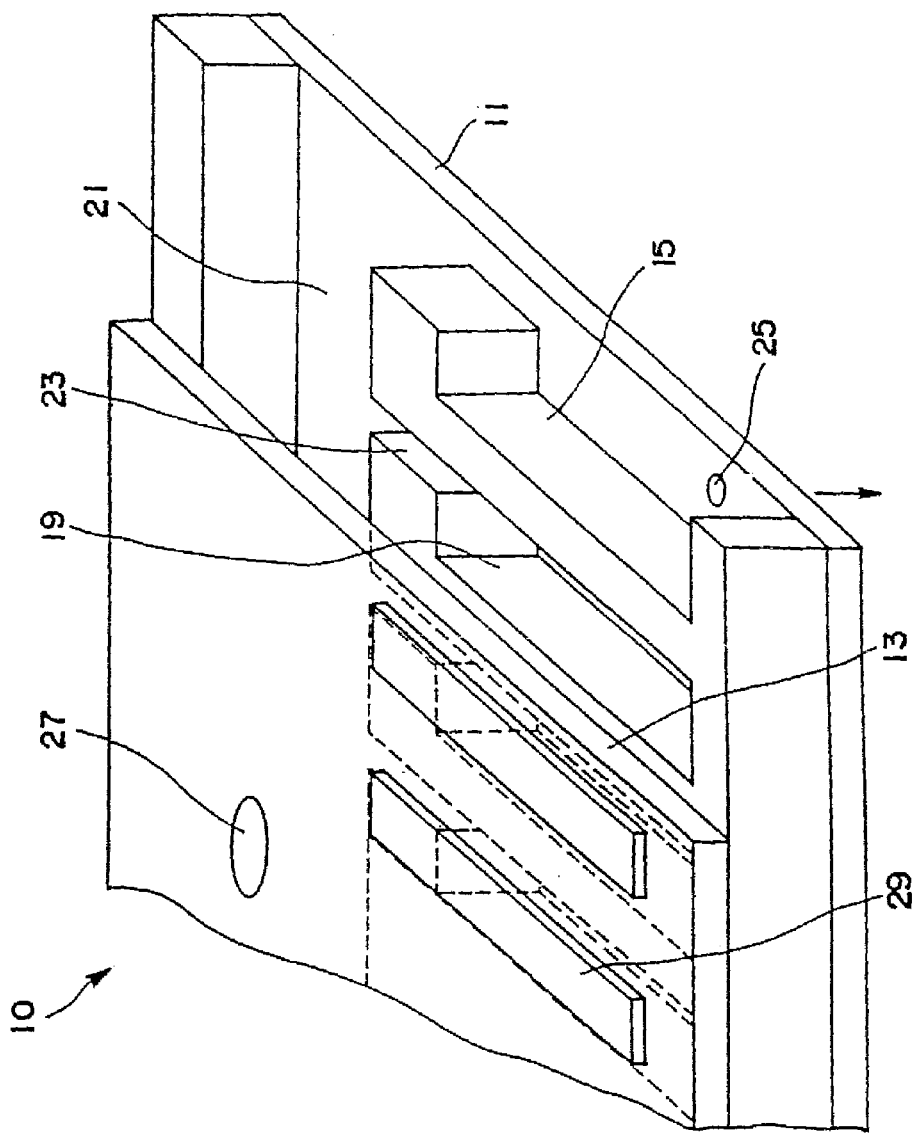
FIG. 10 is a perspective view which shows an example of a configuration of a head for an ink-jet method which is used in the manufacturing method of the organic EL element according to the present invention.
Figure 11:
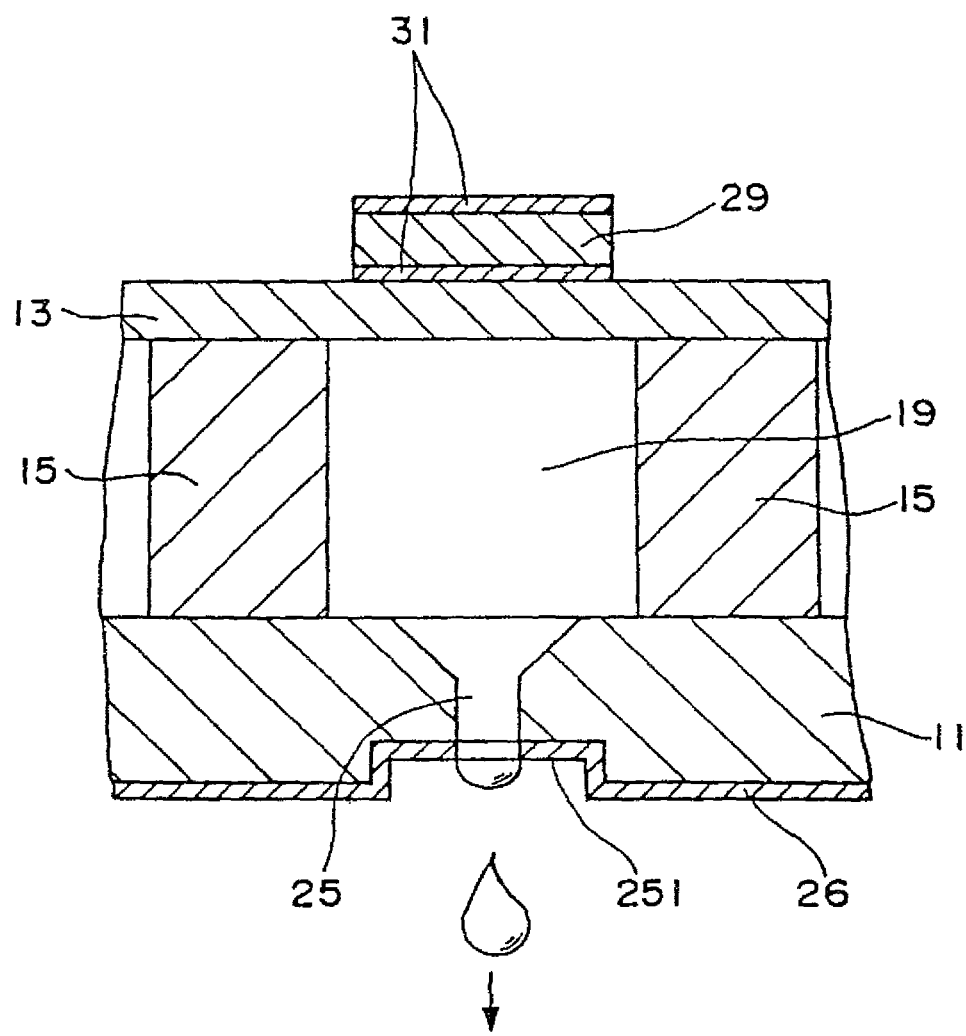
FIG. 11 is a sectional view of the nozzle part of the head for an ink-jet method which is used in the manufacturing method of the organic EL element according to the present invention.

The structure of a head of the ink-jet system used in the manufacturing method of the organic EL element according to the present invention is shown in FIG. 10 and FIG. 11.

The head 10 for the ink-jet system is provided with, for example, a stainless steel nozzle plate 11 and a vibration plate 13, and they are coupled via partitioning members (reservoir plates) 15.

Between the nozzle plate 11 and the vibration plate 13, a liquid storage 21 and a plurality of spaces 19 are formed by means of the reservoir plates 15. The inside of the respective spaces 19 and the liquid storage 21 are filled with the composition according to the present invention, and the spaces 19 communicate with the liquid storage 21 through supply ports 23.

Further, a nozzle hole 25 is provided in the nozzle plate 11 for discharging the composition in a jet-form from the spaces 19. In the meantime, a hole 27 is formed in the vibration plate 13 for supplying the composition to the liquid storage 21.

Further, on a surface of the vibration plate 13 which is opposite to the other surface that faces with the spaces 19, piezoelectric elements 29 are attached at positions corresponding to the positions of the respective spaces 19.

Each of the piezoelectric elements 29 is positioned between a pair of electrodes 31. The piezoelectric element 29 is adapted to bend so as to protrude outward when energized, and at the same time, the vibration plate 13 to which the piezoelectric element 29 is attached is also bent outward together with the piezoelectric element 29. In this way, the volume of the space 19 is increased. With this result, a quantity of the composition corresponding to the increased volume flows into the space 19 from the liquid storage 21 through the supply port 23.

Next, when the piezoelectric element is de-energized, both the piezoelectric element 29 and the vibration plate 13 return to their original shapes. In this way, the space 19 also returns to its original volume, so that the pressure exerted to the composition within the space 19 goes up, whereby the composition is jetted out from the nozzle hole 25 toward the substrate.

In this connection, a water repellent layer 26 is formed at the peripheral part of the nozzle hole 25 in order to prevent the bend of the jetted direction of the composition and the clogging of the hole from occurring.

Namely, a water repellent layer 26 formed of, for example, a Ni-tetrafluoroethylene eutectoid plated layer is provided in the peripheral part of the nozzle hole 25 as shown in FIG. 11.

Using the head with the above construction, it is possible to form respective organic luminescent layers by discharging the compositions corresponding to, for example, the three primary colors red, blue, and green according to a predetermined pattern, thereby enabling to form the pixels.

In the manufacturing method of the organic EL element according to the present invention, compositions with the following characteristics can be used as organic luminescent materials for the ink-jet method.

It is preferable that the compositions have a contact angle of 30 to 170 degrees, and more preferably, 35 to 65 degrees, with respect to the material constituting the nozzle surface 251 of the nozzle provided in the head for the ink-jet system for discharging the composition. When the composition has the contact angle given in this range, it is possible to carry out a precise patterning by suppressing the bend in the jetted direction of the composition.

Namely, if the contact angle is less than 30 degrees, wettability of the composition with respect to the material constituting the nozzle surface increases, so that there is a case that the composition attaches asymmetrically to the periphery of the nozzle hole at the time of discharging the composition. In this case, an attraction acts between the composition attached to the nozzle hole and the composition to be discharged. This causes the discharge of the composition by a non-uniform force, which gives rise to a situation so-called "bend in the jetted direction" in which the composition is unable to reach the target position, and also to an increase in the occurrence frequency of the bend in the jetted direction. Meantime, if the contact angle exceeds 170 degrees, the interaction between the composition and the nozzle hole becomes a minimum and the shape of the meniscus at the tip of the nozzle is unstable, so that the control of the amount and the timings of discharge of the composition tends to be difficult.

In the above descriptions, what is meant here by the bend in the jetted direction refers to a situation in which, when the composition is discharged from the nozzle, the point of impact of a dot deviates from the target position by more than 50 μm. Further, the occurrence frequency of the bend in the jetted direction is defined as the time until the bend in the jetted direction occurs after a continuous discharge of the composition is started at the frequency of 7200 Hz. The bend in the jetted direction is generated principally by such causes as the nonuniformity in the wettability of the nozzle hole and the clogging of the nozzle hole by the attachment of solid components of the composition. Such bend in the jetted direction can be eliminated by cleaning the head. In this connection, more frequent head cleaning is required for more frequency of occurrence of the bend in the jetted direction, and such a composition that arises the higher occurrence frequency can be said to a composition that deteriorates the manufacturing efficiency of the EL element by the ink-jet method. On the practical level, an occurrence frequency of the bend in the jetted direction is required to be more than 1000 seconds.

By preventing such bend in the jetted direction from occurring, it becomes possible to carry out a highly fine patterning with high precision.

Further, it is preferable that the viscosity of the composition is 1 to 20 cp, and more preferably 2 to 4 cp. If the viscosity of the composition is less than 1 cp, the contents of the precursor and the fluorescent dye in the material are too small, so that the luminescent layer which is formed cannot exhibit luminescence power sufficiently. On the other hand, if it exceeds 20 cp, it is impossible to discharge the composition smoothly from the nozzle, and it becomes difficult to carry out patterning unless otherwise such a change in the specification as the enlargement of the diameter of the nozzle hole is introduced. In addition, when the viscosity of the composition is high, precipitation of the solid components in the composition tends to occur, thus leading to an increased occurrence frequency of clogging of the nozzle hole.

Furthermore, it is preferable that the composition has the surface tension of 20 to 70 dyne/cm, and more preferably 25 to 40 dyne/cm. By restricting the surface tension to such a range, it is possible to suppress the bend in the jetted direction and suppress the occurrence frequency of the bend in the jetted direction to a low level, in the same manner as the case of the above-mentioned contact angle. If the surface tension is less than 20 dyne/cm, the wettability of the composition with respect to the material constituting the nozzle surface increases, which results in the occurrence of the bend in the jetted direction, and an increase in the occurrence frequency of the bend in the jetted direction, similar to the case of the contact angle. On the other hand, if it exceeds 70 dyne/cm, the shape of the meniscus at the tip of the nozzle is not stable, which results in the difficulty in the control of the amount and the timings of discharge of the composition.

Further, as for the composition of the organic luminescent material suitable for the manufacturing method of the organic EL element of this invention, it needs to satisfy the condition on the numerical range for at least one of the characteristics including the contact angle, the viscosity and the surface tension described above. In this connection, a composition which satisfies the conditions for the arbitrary combination of two characteristics is more preferable, and a composition which satisfies the conditions for all the characteristics is most preferable.

Figure 2:
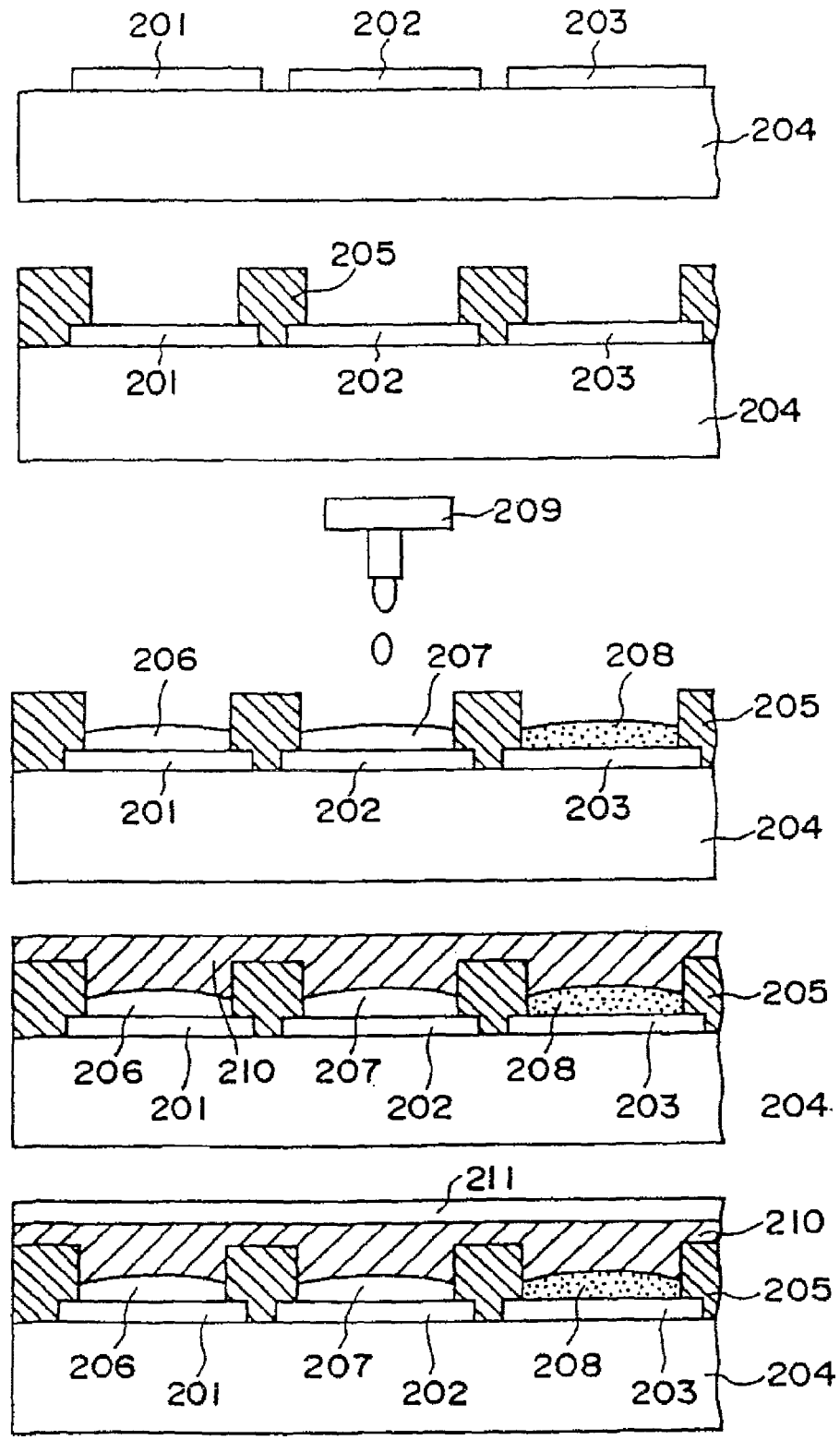
FIG. 2 is a sectional view which shows a second embodiment of a manufacturing method for an organic EL element according to the preset invention.

FIG. 2 shows a second embodiment of the manufacturing method of the organic EL element according to the present invention.

In this second embodiment, after formation of pixel electrodes 201, 202 and 203 and banks 205 on a transparent substrate 204, a red luminescent layer 206 and a green luminescent layer 207 are formed by using an ink-jet method in the same manner as the first embodiment.

This second embodiment is different from the first embodiment in the point that a hole injection and transfer layer 208 is formed on the pixel electrode 203 and then a blue luminescent layer 210 is laminated on the layer 208. By the lamination of the hole injection and transfer layer 208 with the blue luminescent layer, it becomes possible to promote the injection and transfer of the holes from the electrode to improve the luminous efficiency as mentioned above.

Thus, in the manufacturing method for the organic EL element according to the present invention, it is preferable to laminate a hole injection and transfer layer with at least one luminescent layer with a certain color. In this way, it is possible to improve the luminous efficiency and to improve the stability of the thin film element itself.

In this case, at the vicinity of the interface between the luminescent layer and the hole injection and transfer layer which are laminated with each other, a part of the materials contained in either of layers may exist in the state of mutual impregnation and diffusing into the other layer.

It is preferable that the hole injection and transfer layer 208 is a non-luminescent layer. With this arrangement, it is possible to make a region of the blue luminescent layer 210 positioned above the pixel electrode 203 to be a luminescent portion, thereby enabling to fabricate a full color organic EL element more easily.

No particular limitation is imposed upon the forming method for such a hole injection and transfer layer 208, but for example, it is possible to form the layer by using the ink-jet method. In this way, it becomes possible to arrange the hole injection and transfer layer 208 precisely with a predetermined pattern.

As for examples of the material constituting the hole injection and transfer layer 208, aromatic diamine based compound such as TPD; MTDATA; quinacridone; bisstil anthracene derivative; PVK (polyvinyl carbazole); phthalocyanine based complex such as copper phthalocyanine; porphin based compound; NPD; TAD; polyaniline; and the like can be mentioned. Among these materials, PVK is particularly preferred. By using PVK, it becomes possible to form a non-luminescent hole injection and transfer layer.

Further, the organic EL element according to the present invention can be obtained by forming a blue luminescent layer 210 and a cathode 211 in the same way as the first embodiment. The materials constituting the blue luminescent layer 210 and the cathode 211 and the manufacturing method thereof are the same as those of the first embodiment.

Figure 3:
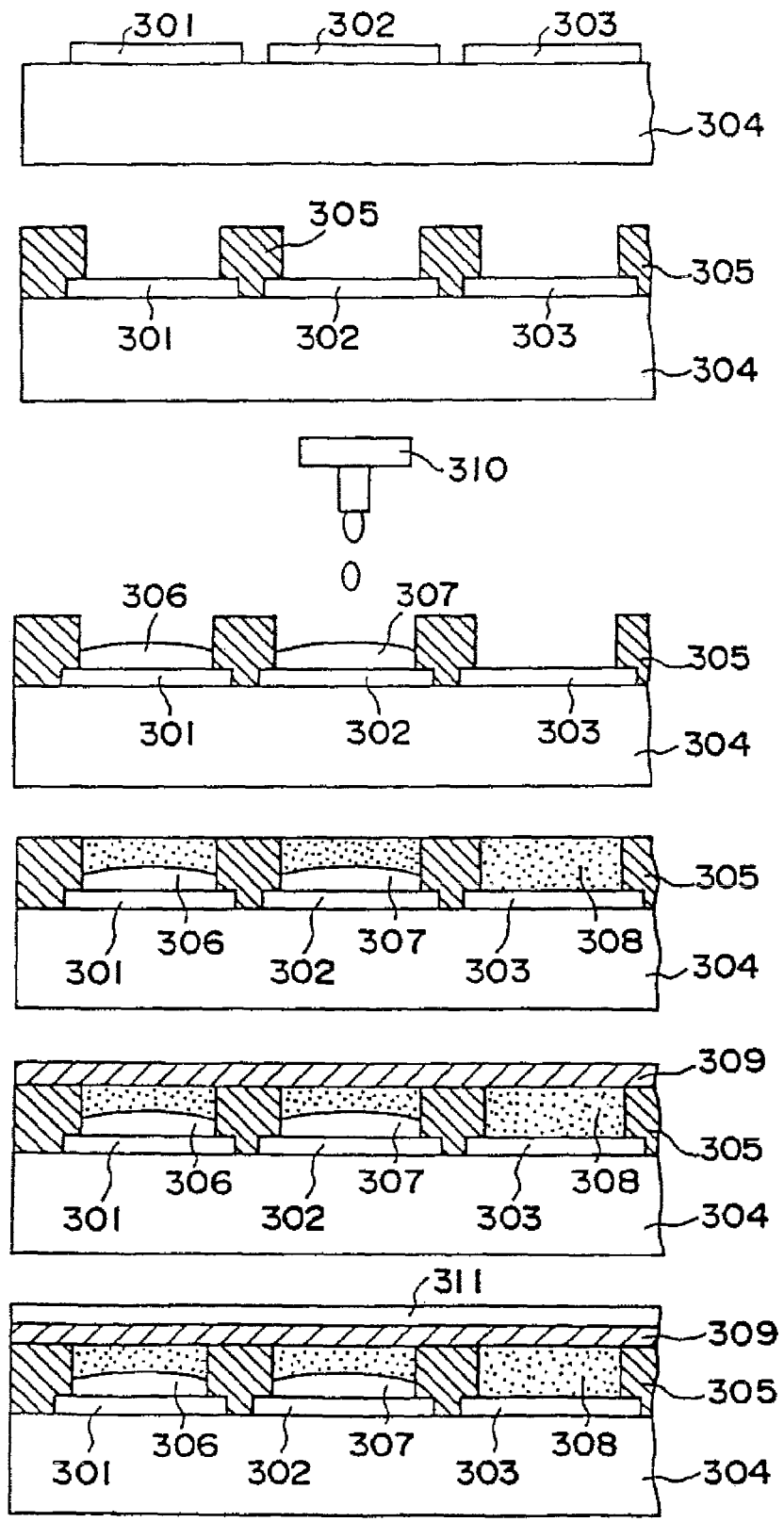
FIG. 3 is a sectional view which shows a third embodiment of a manufacturing method for an organic EL element according to the present invention.

FIG. 3 shows a third embodiment of the manufacturing method for the organic EL element according to the present invention.

In this third embodiment, after the formation of pixel electrodes 301, 302 and 303 and banks 305 on a transparent substrate 304, a red luminescent layer 306 and a green luminescent layer 307 are formed in the same manner as the first embodiment.

Next, a hole injection and transfer layer 308 is formed on the entire surface of the red luminescent layer 306, the green luminescent layer 307 and the pixel electrode 303. By laminating the hole injection and transfer layer 308 with the luminescent layers 306 and 307 in this way, it is possible to promote the injection and the transfer of the holes from the electrodes to improve the luminescence efficiency, as described in the above.

Further, by the same reason as in the above, it is preferable that the hole injection and transfer layer 308 is formed into a non-luminescent layer.

No particular limitation is imposed upon the forming method for the hole injection and transfer layer 308, and for example, ink-jet method, vacuum deposition method, dipping method, spin coating method, casting method, capillary method, roll coating method, bar coating method and the like can be mentioned. In this embodiment, it is to be noted that the hole injection and transfer layer can be formed using the vacuum deposition method. In this connection, as for the material constituting the hole injection and transfer layer 308, the same materials as those mentioned in the second embodiment can be used.

Further, by forming a blue luminescent layer 309 and a cathode 311 on the hole injection and transfer layer 308, the organic EL element according to the present invention can be obtained. The constituent material and the forming method of the cathode 311 are the same as those of the above-mentioned embodiments.

Figure 4:
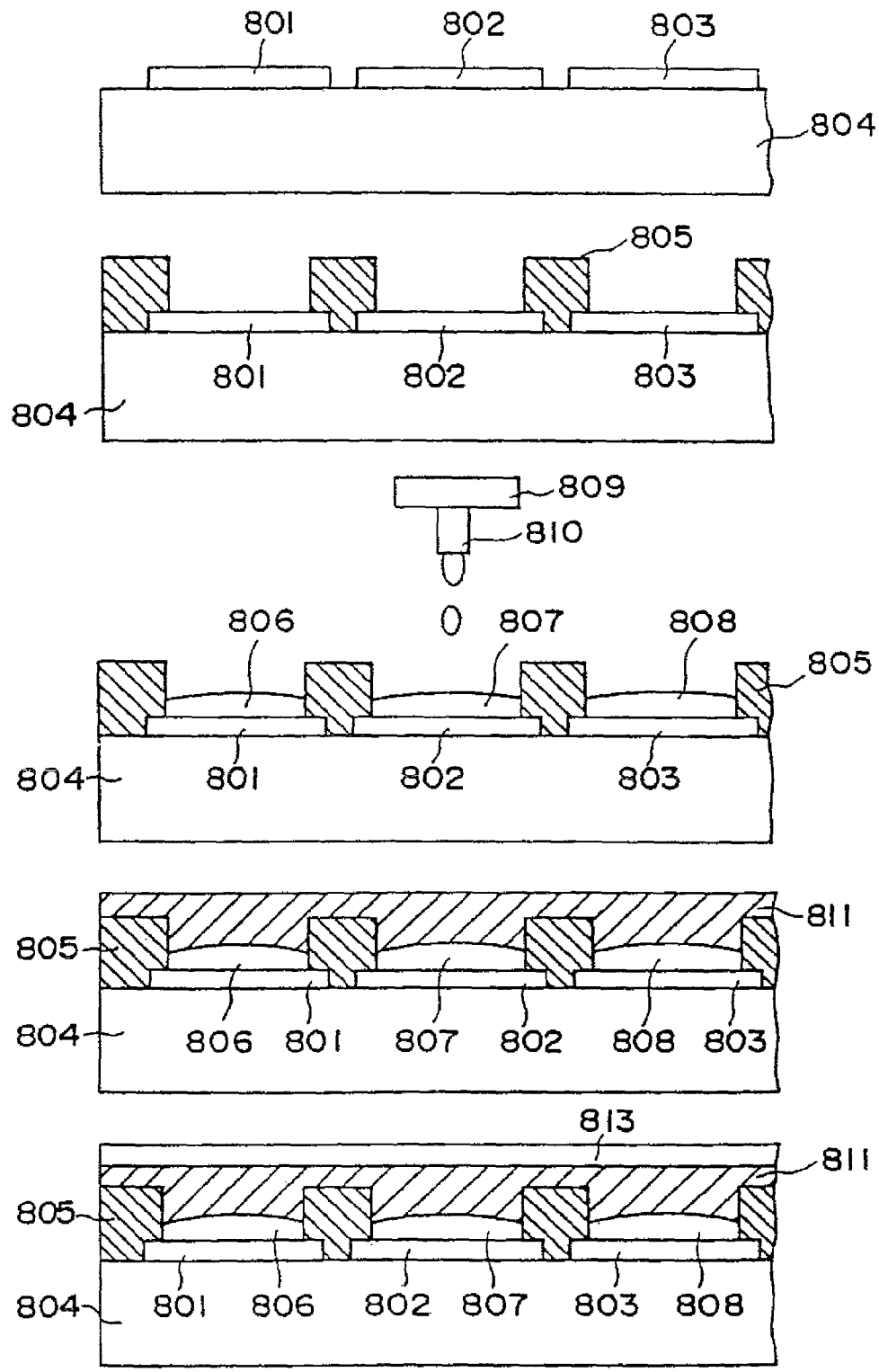
FIG. 4 is a sectional view which shows a fourth embodiment of a manufacturing method for an organic EL element according to the present invention.

FIG. 4 shows a fourth embodiment of the manufacturing method for the organic EL element according to the present invention.

In this fourth embodiment, after the formation of pixel electrodes 801, 802 and 803 and banks 805 on a transparent substrate 804 in the same way as the first embodiment, luminescent layers 806, 807 and 808 are patterned on the pixel electrodes 801, 802 and 803, respectively, by the ink-jet method. In this way, the amount of the material to be discharged for the respective luminescent layers, the number of times of the discharge and the formation pattern of the luminescent layers, for example, can be adjusted easily and handily, so that the luminescent characteristics and film thickness and the like of the respective luminescent layers can be controlled easily.

In addition, an electron injection and transfer layer 811 is faulted on the luminescent layers 806, 807 and 808. The electron injection and transfer layer 811 facilitates the injection of the electrons from the cathode, and contributes to the prevention of electrode extinction by keeping the luminescent portions away from the cathode to establish a better contact with the cathode. As for the electron injection and transfer layer 811, aluminum quinolynol complex to which the doping is not carried out can be used. This electron injection and transfer layer 811 can be formed by means of a vacuum deposition method.

In this connection, the forming method for the electron injection and transfer layer 811 is not limited to this method, and for example, the ink-jet method, vacuum deposition method, dipping method, spin coating method, casting method, capillary method, roll coating method, bar coating method or the like can be used.

Further, the organic EL element according to the present invention can be obtained by forming a cathode 813 on top of it. The constituent material and the formation method of the cathode 813 are the same as those of the above-mentioned embodiments.

Figure 5:
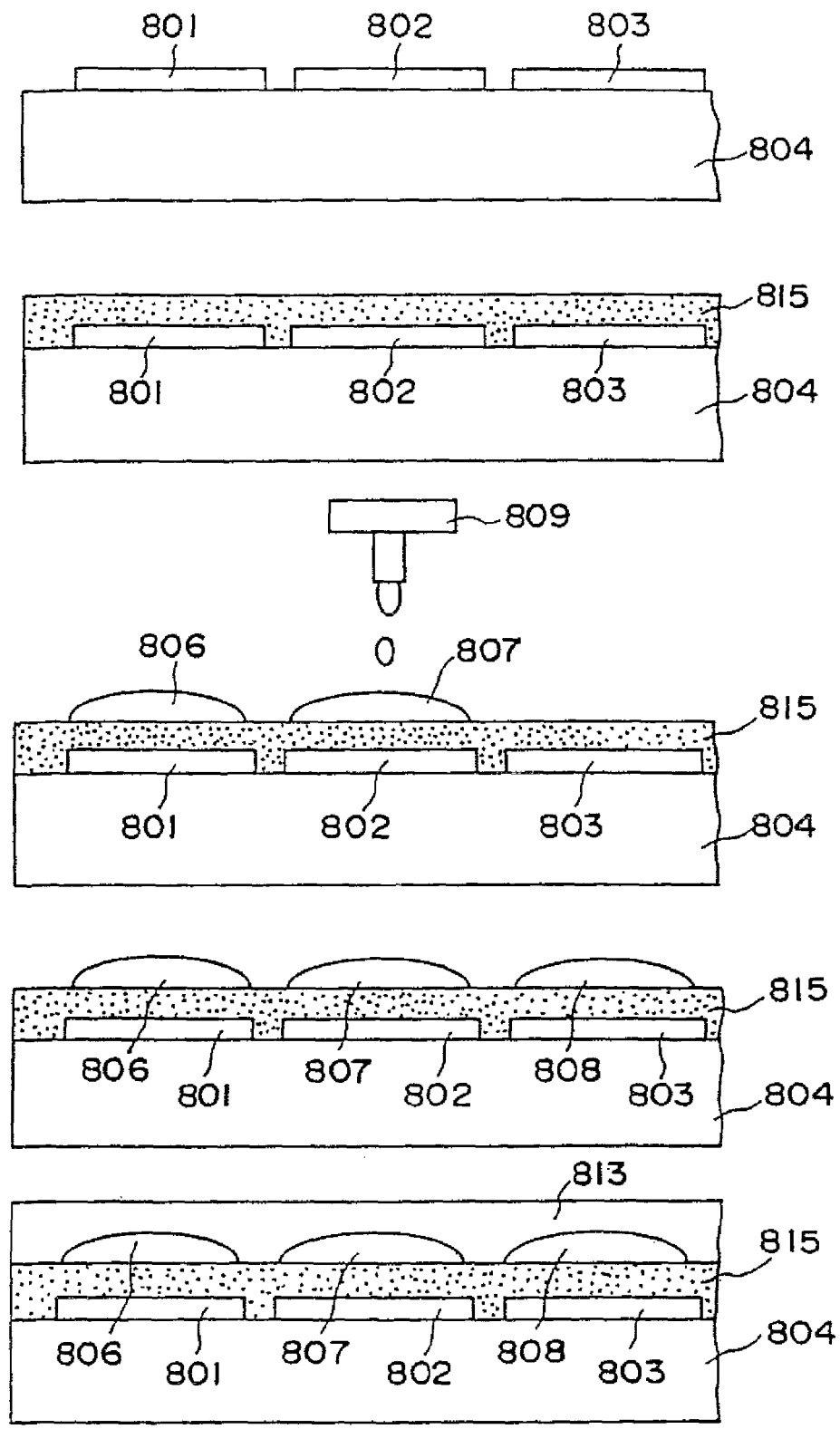
FIG. 5 is a sectional view which shows a fifth embodiment of a manufacturing method for an organic EL element according to the preset invention.

FIG. 5 shows a fifth embodiment of the manufacturing method of the organic EL element according to the present invention.

In this fifth embodiment, pixel electrodes 801, 802 and 803 are first formed on a transparent substrate 804 in the same manner as the first embodiment. Then, a hole injection and transfer layer 815 which is for example made of PVK is formed on the entire surfaces of the pixel electrodes by means of, for example, a spin coating method. Accordingly, since the hole injection and transfer layer 815 in this embodiment can be formed by means of coating without need of patterning, it is possible to increase manufacturing efficiency.

No particular limitation is imposed upon the forming method for the hole injection and transfer layer 815, and for example, ink-jet method, vacuum deposition method, dipping method, spin coating method, casting method, capillary method, roll coating method, bar coating method and the like can be used.

Further, from the same reason described above with reference to the other embodiments, it is preferred that the hold injection and transfer layer 815 is formed into a non-luminescent layer.

On top of the hole injection and transfer layer 815, luminescent layers 806, 807 and 808 are formed. In this regard, it is preferred that among these luminescent layers, at least one luminescent layer for a certain color is formed by pattering using the ink-jet method carried by the ink-jet device 809.

Then, by forming a cathode 813 on top of the luminescent layers, an organic EL element according to the present invention can be obtained. The structural material for the cathode 813 and the manufacturing method thereof are the same as those of the other embodiment described above.

According to this fifth embodiment, no bank is formed. However, by using this manufacturing method, the coating of the luminescent layers for the primary colors R, G and B can be carried out correctly and preciously, thus leading to improvement of manufacturing efficiency. In this regard, it is to be noted that the manufacturing method of this embodiment can be also applied to the case where banks are provided to form respective pixels like the previous embodiments.

The organic EL element of the present invention can be manufactured according to the manufacturing methods described above with reference to the embodiments. However, the present invention is not limited to the structures provided by these methods, and the following structures can be adopted, for instance.

Figure 15:
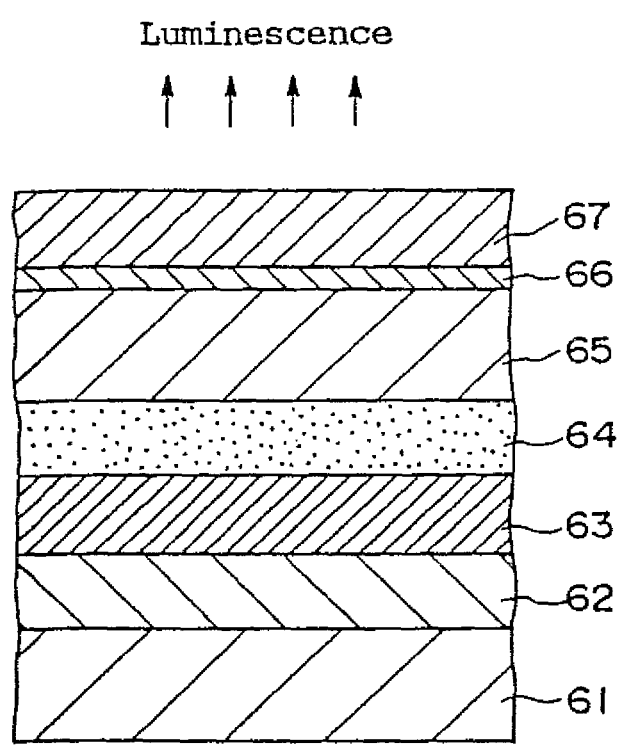
FIG. 15 is a partial sectional view which shows another embodiment of an organic EL element according to the present invention.

FIG. 15 is a partial cross-sectional view which shows other embodiment of an organic EL element according to the present invention.

The organic EL element of this embodiment has a construction in which a reflection layer 62, a transparent conductive film (ITO film) 63, a hole injection and transfer layer 64, an organic luminescent layer 65, a metal layer 66 and a transparent conductive layer (ITO film) 67 are laminated on a transparent substrate 61 in this order. Hereinbelow, the materials and the manufacturing methods of the respective layers (films) are described, in which a description is made only for the differences from the previous embodiments and the common explanation is omitted.

In the organic EL element according to this embodiment, on the transparent substrate 61, the reflection layer 62 which is made from a metal thin film such as Al is provided directly.

The metal layer 66 which is laminated onto the luminescent layer 65 as a cathode is extremely thin (approximate to 10 to 50 Å), so that the metal layer has a light permeability so as to pass emitted light from the luminescent layer 65 therethrough. On the other hand, since the metal layer is extremely thin, its value of resistance is high and therefore its conductivity is insufficient. Therefore, the metal layer can not sufficiently exhibit function as the cathode. For this reason, the transparent conductive film (ITO film) 67 is laminated onto the metal layer 66. In this connection, it is to be noted that such a metal layer 66 can be made from Al—Li alloy or the like for example, and it can be formed using the vacuum deposition method, sputtering method or the like.

By using the above described construction, light which is converted in the luminescent layer 65 from a current which has been injected from the electrodes is transmitted in the direction indicated by the arrow in the drawing. With this result, it becomes possible to take out the light without passing through the transparent substrate 61, so that a display with a higher brightness becomes possible.

Figure 7:
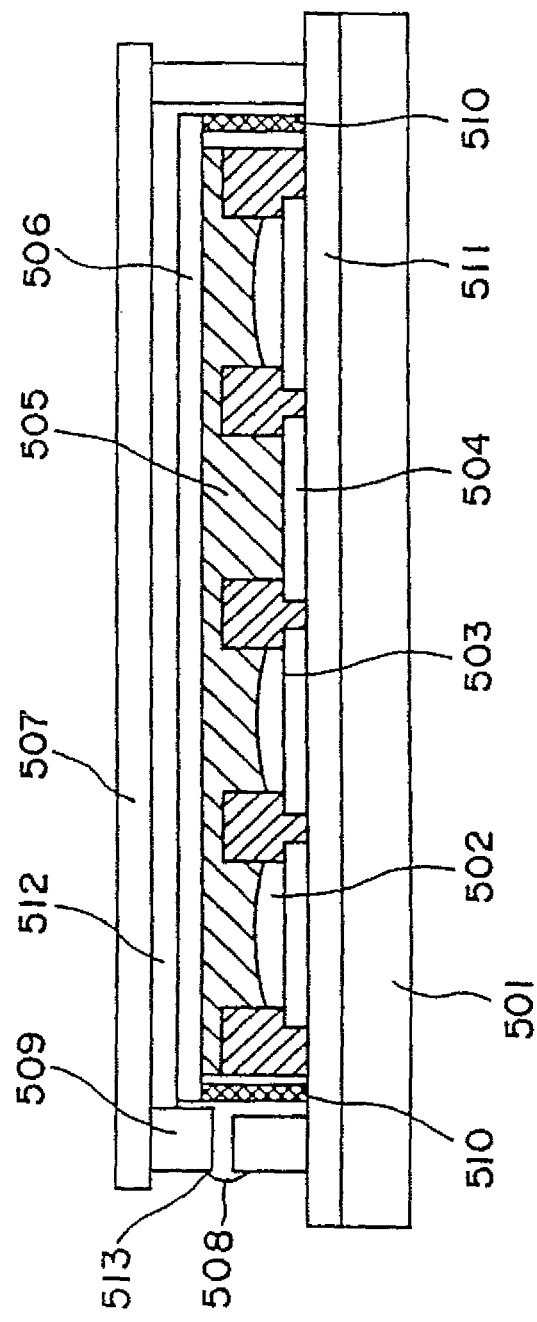
FIG. 7 is a sectional view which shows an example of an organic EL display device using the organic EL element according to the present invention.

FIG. 7 is an illustration which shows an embodiment of an organic EL display device according to the present invention.

In this embodiment, a bus line (gate line) 511 made of Al is formed on a glass plate 501 by means of a photolithography patterning method, and a thin film transistor (not shown in the drawing) is formed thereon to constitute the ITO transparent pixel electrode 504 and the like. Then, as is the same manner as the first embodiment, a red luminescent layer 502 and a green luminescent layer 503 are formed by means of the ink-jet method, and then a blue luminescent layer 505 is formed by means of the vacuum deposition method. Thereafter, a cathode 506 is formed by means of the vacuum deposition method, thereby constructing the organic EL element same as the first embodiment described above.

In addition, a protective base material 507 is stuck onto the transparent substrate 501 in a fixed manner by means of a peripheral seal 509.

Next, this assembly is placed in an inert gas atmosphere such as argon gas or the like, and thereby introducing the inert gas inside thereof from a seal opening 513 and then the seal opening 513 is sealed with a seal member 508. By filing the inside of the assembly with the inert gas 51 and then sealing it, as described above, it becomes possible to protect the organic EL element from external contamination such as moisture or environmental changes, thereby enabling to maintain the luminescent characteristics of the organic EL display device. In this case, it is preferred that the seal member 508 is formed form a material through which the inert gas 512 does not penetrate.

A silver paste 510 has a function that realizes a contact between the cathode 506 and the gate line 511 on the element.

Gate lines 511 are provided to control ON and OFF of the thin film transistors (TFT), which are provided in the respective display pixels, in each line of the pixels in order to select pixels to be displayed. Upon writing, potential of the gate line for one line of pixels is turned into a selected level, thereby bringing the TFTs on this line into a conductive state. At this time, by supplying picture signals for the corresponding pixels from the source electrode wires of the respective lines (not shown in the drawing), the voltages of the picture signals are applied to the pixel electrodes through the TFTs, thereby enabling to charge the potentials to the pixels to a level of a signal voltage and then discharge them.

Figure 8:
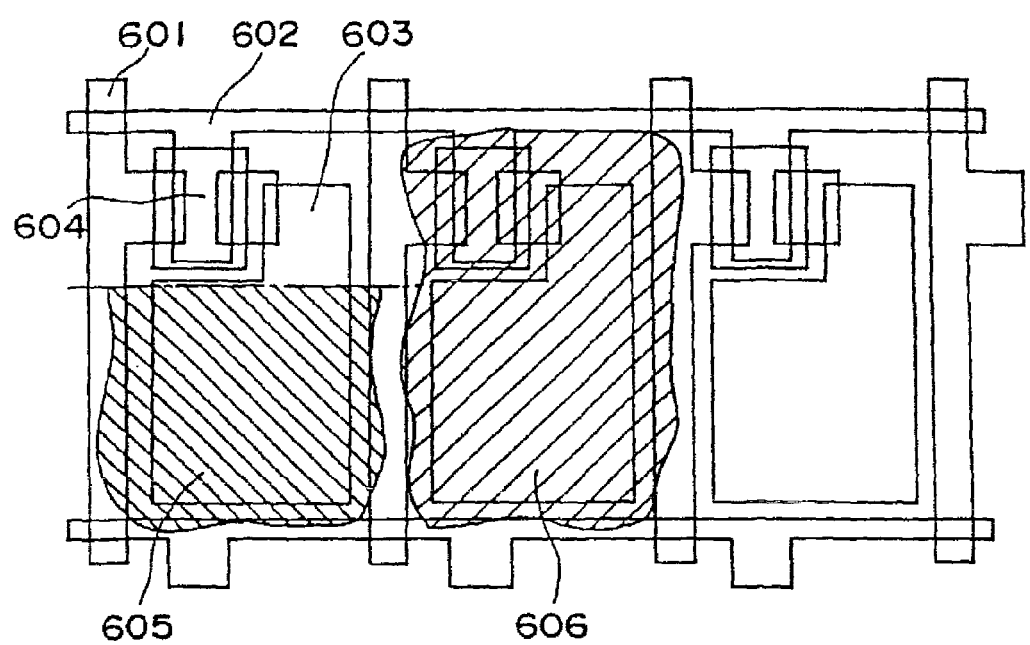
FIG. 8 is a diagram which shows an example of an active matrix type organic EL display device using the organic EL element according to the present invention.

FIG. 8 is an illustration which shows other embodiment of an active matrix type organic EL display device using the organic EL element according to the present invention. This organic EL display device of this embodiment includes an pixel arrangement comprised of a plurality of luminescent pixels which are arranged in a matrix form and which are formed into any one of R, G and B luminescent elements.

As shown in this figure, on the substrate (not shown), there are provided signal lines (signal electrodes) 601 and gate lines (gate electrodes) 602 which are arranged in a matrix form so as to be orthogonal to each other. Further, in each of the pixels, a thin film transistor (TFT) 604 which is connected to both the signal line 601 and the gate line 602 is provided, and a luminescent layer 605, 606 which is formed of the organic EL element and connected to the TFT is laminated on the TFT. In this case, at least one luminescent layer for any one of colors R, G, B is framed by means of the ink-jet method.

Figure 9:
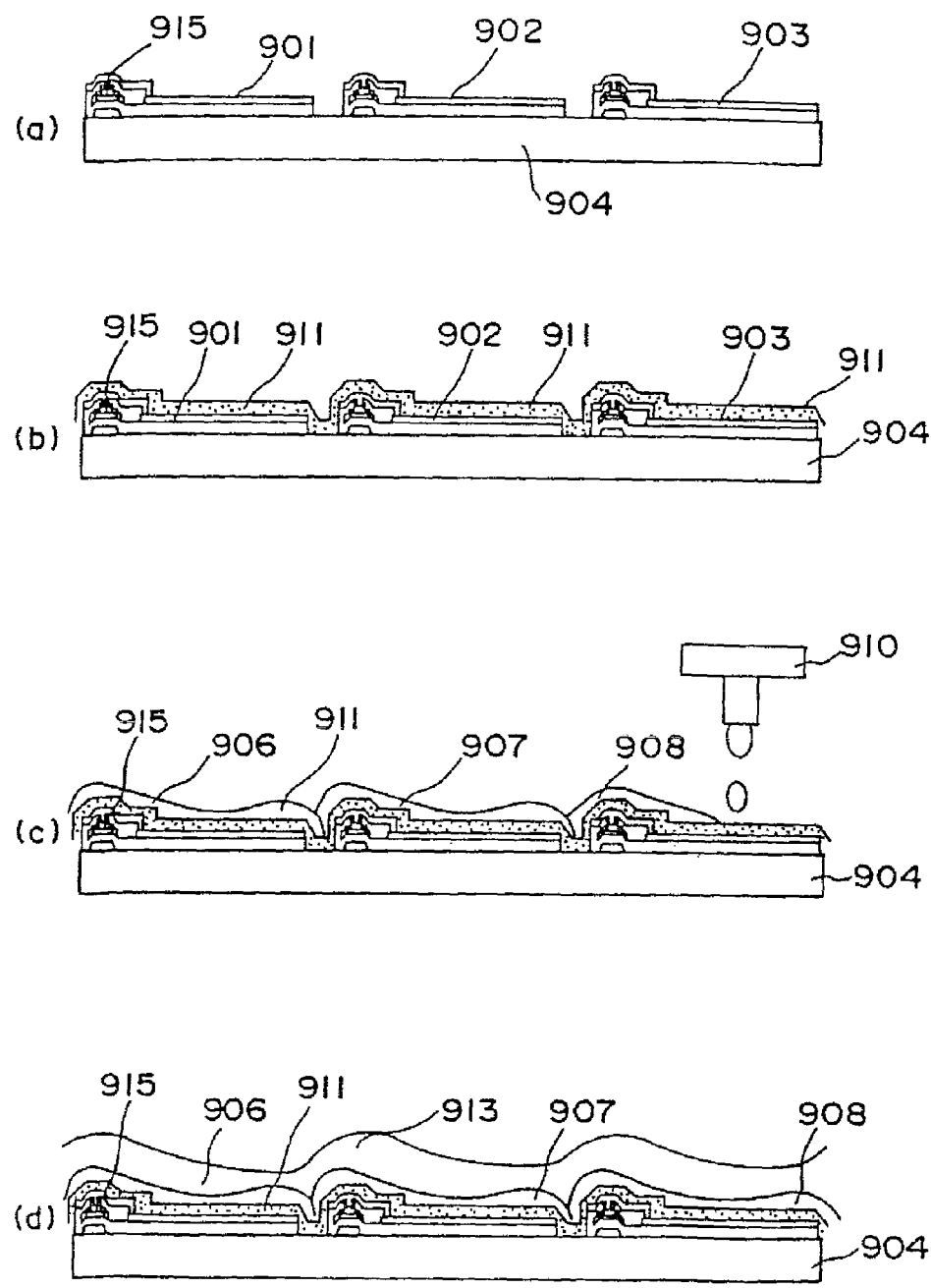
FIG. 9 is a sectional view which shows an example of a manufacturing method of the active matrix type organic EL display device.

FIG. 9 is a sectional view which shows one example of the manufacturing method of the active matrix type organic EL display device according to the present invention.

First, on a transparent substrate 904, predetermined thin film transistors 915 as well as gate lines and signal lines (not shown) and the like are formed. Next, on respective pixel electrodes (ITO) 901, 902, 903 which are respectively provided with prescribed functional elements such as the thin film transistors 915, hole injection and transfer layers 911 are formed so as to cover the respective pixel electrodes. As for the hole injection and transfer type material, the same materials that are discussed in this specification with reference to the previous embodiments can be used. Further, the method of forming the hole injection and transfer layer 911 is not limited to a specific method, and it is possible to form the layer by means of any method described above.

Further, respective luminescent layers 906 (red), 907 (green) and 908 (blue) are formed by patterning. In the formation of these luminescent layers, at least one layer for one color is formed by the ink-jet method using an ink-jet device 910.

Finally, a reflection electrode 913 is formed, thereby completing the organic EL display device according to the present invention. As for the reflection electrode 913, Mg—Ag electrode having a thickness of about 0.1 to 0.2 μm or the like is formed, for instance.

In the above-mentioned embodiment concerning the active matrix type organic EL display device according to the present invention, a thin film transistor is used as a switching element, but the present invention is not limited thereto. Other switching elements and two-terminal element such as MIM can be used. Further, the display device may be configured into a passive drive type or a static drive type (static image, segment display).

Furthermore, the number of the switching element is not limited to one per one pixel. A plurality of switching elements may be provided per one pixel.

Figure 12:
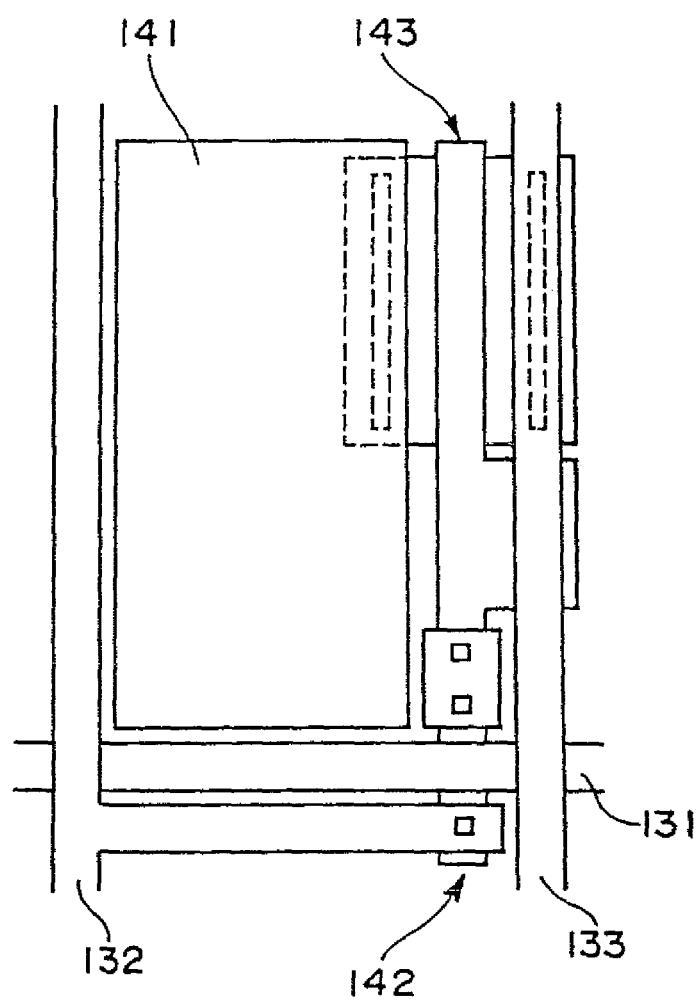
FIG. 12 is a diagram which shows another embodiment of an organic EL display device according to the present invention.

FIG. 12 shows an embodiment of an organic EL display device in which a plurality of switching elements are provided per one pixel. In this embodiment, a switching type thin film transistor 142 carries out a role that transmits the potential at a signal electrode 132 to a current thin film transistor 143 in response to the potential at a scanning electrode 131, and the current thin film transistor 143 carries out a role that controls electrical connection between the common electrode 133 and the pixel electrode 141.

Next, referring to the drawings, a description is made with regard to an embodiment of a passive matrix type (simple matrix type) organic EL display device using the organic EL element according to the present invention.

Figure 13:
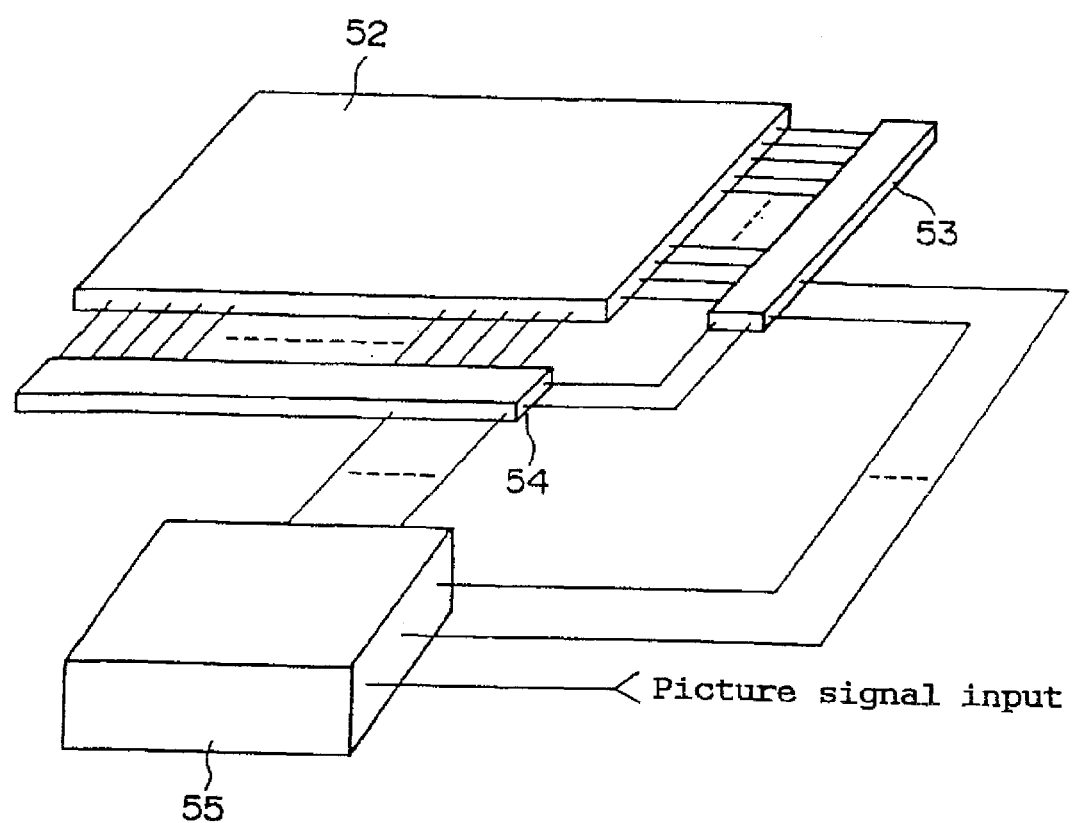
FIG. 13 is a schematic perspective view of an organic EL display device according to the present invention.

FIG. 13 is a perspective view which roughly shows a structure of the organic EL display device according to the present invention.

As shown in the drawings, in the organic EL display device of this embodiment, a scanning electrode 53 and a signal electrode 54 which are formed into an elongated strip, respectively, are arranged outside the organic EL element 52 so that scanning lines extending from the scanning electrode 53 and the signal lines extending from the signal electrode 54 are orthogonal to each other through the organic EL element.

Such a passive matrix type display device is driven by selecting scanning lines of the scanning electrode 53 in a pulsed manner in a sequential order while a voltage is applied to signal lines of the signal electrode 54 corresponding to pixels to be displayed on the scanning line. Such selection of the lines is carried out by a controller 55.

In this connection, it should be noted that in a case of the passive drive type display device, it is necessary that a cathode is patterned so as to be separate forms to correspond to each of lines. For example, when a thin cathode having a thickness of about 0.2 μm is formed according to the third embodiment, such separate forms of the cathode can be automatically obtained since the cathode is separated by the banks.

Such a cathode is formed by the pattern formation performed by a masking deposition method or a laser cutting method, for instance.

Figure 14:
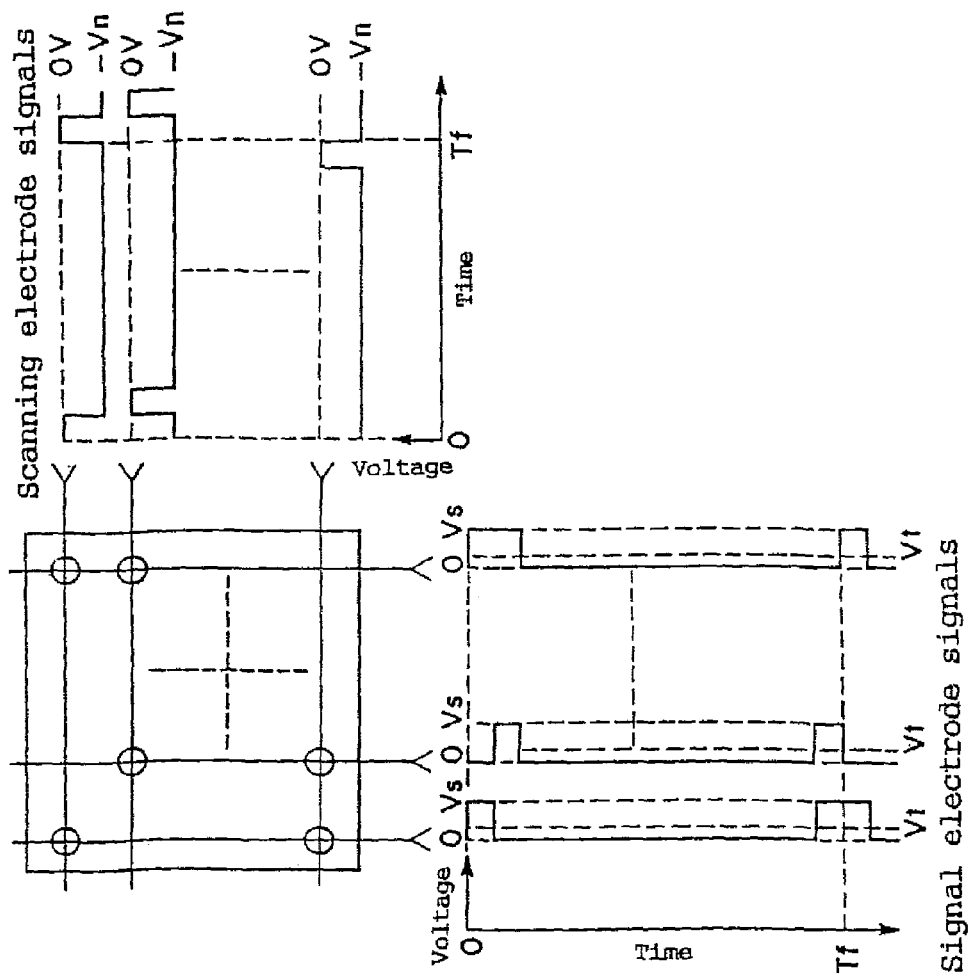
FIG. 14 is a diagram which shows an example of the waveform of the driving voltage applied to the electrodes.

FIG. 14 is a diagram which shows one example of wave forms of driving voltages applied to the scanning electrode 13 and signal electrode 14, respectively. The wave forms shown in the drawing are determined so as to be able to apply a voltage Vs which is sufficient to luminescence to selected pixels. Further, the brightness of a pixel to be displayed is controlled through the width of the pulse from the signal electrode 14 that has been determined so as to meet with a gray scale of the brightness to be displayed. On the other hand, a voltage Vn which is lower than a luminescent threshold voltage is applied to respective non-selected pixels.

In FIG. 14, Tf shows a scanning timing. In this case, the scanning signal is driven by a pulse having a duty ration of 1/100. In this connection, it has been confirmed that the luminescence of the blue luminescent layer 808 of the organic EL display device comprised of the organic EL elements of the fourth embodiment was a brightness of 100 cd/m2 at a driving voltage of 20V.

EXAMPLES

Manufacturing of Organic EL Elements

Example 1

As shown in FIG. 1, on the glass substrate 104, ITO transparent pixel electrodes 101, 102 and 103 were formed by means of photolithography so as to form a pattern having a pitch of 100 μm and a thickness of 0.1 μm.

Then, the spaces between the ITO transparent pixel electrodes were buried, and then banks 105 which act not only as a light cut-off layer but also an ink drop preventing wall were formed by photolithography. In this case, the banks 105 were designed so as to have a width of 20 μm and a thickness of 2.0 μm.

Further, after the pattern formation with red and green luminescent materials shown in Table 1 and Table 2 which were jetted from the head 110 of the ink-jet device 109, they were undergone heat treatment under a nitrogen atmosphere for hours to polymerize the precursors in the compositions of the materials, thereby forming luminescent layers 106 (red) and 107 (green).

Then, by carrying out a vacuum deposition of aluminum quinolynol complex to which perylene condensed aromatic was added as a dopant, a blue luminescent layer 108 of the electron injection and transfer type having a thickness of 0.1 μm was formed.

At the last, a Mg—Ag electrode 113 having a thickness of 0.8 μm was formed as a cathode using a vacuum deposition method to obtain an organic EL element.

Example 2

In the same manner as Example 1, ITO transparent pixel electrodes 201, 202, 203 were formed on a glass substrate 204 as shown in FIG. 2. Thereafter, the spaces between the ITO transparent pixel electrodes were buried and then resists (partitioning walls) 205 made of a light-sensitive polyimide and functioning not only as a light cut off layer but also an ink drop preventing wall were formed.

Then, after coating and pattern formation of red and green luminescent materials shown in Table 1 and Table 2, respectively, by using an ink-jet device 209 in the same way as the Example 1, they were undergone heat treatment under a nitrogen atmosphere for four hours to polymerize the precursors in the compositions of the materials, thereby forming luminescent layers 206 (red) and 207 (green).

Next, a hole injection and transfer layer made of polyvinyl carbazole (PVK) was patterned on the transparent pixel electrode 203 by means of the ink-jet device 209. Then, a blue luminescent layer 210 was formed by coating the pyrazoline dimer on top of the hole injection and transfer layer.

Finally, an Al—Li electrode 211 having the thickness of 0.8 μm was formed as the cathode by the deposition method, and thereby the organic EL element was manufactured.

Example 3

First, ITO transparent pixel electrodes 801, 802 and 803 and banks 805 were foamed on a glass substrate 804 as shown in FIG. 4 in the same way as Example 1.

Next, an organic hole injection and transfer type material was mixed in the luminescent materials shown in Table 1 and Table 2 to form luminescent layers 806 (red), 807 (green) and 808 (blue) by using an ink-jet device 809.

Next, the vacuum deposition was carried out using the aluminum quinolynol complex to which the doping was not carried out to form an electron injection and transfer layer 811 having the thickness of 0.1 μm.

Finally, an Al—Li electrode 813 having the thickness of 0.2 μm was formed as the cathode by the deposition method, and thereby the organic EL element was manufactured.

Example 4

In the same way as Example 1, ITO transparent pixel electrodes 301, 302 and 303 and banks 305 were formed on a glass substrate 304 as shown in FIG. 3.

Next, after coating and pattern formation with red and green luminescent materials shown in Table 1 and Table 2, respectively, by using an ink-jet device 310 in the same way as Example 1, they were undergone heat treatment under a nitrogen atmosphere for four hours to polymerize the precursors in the compositions of the materials, thereby forming luminescent layers 306 (red) and 307 (green).

Next, a hole injection and transfer layer 308 made of polyvinyl carbazole (PVK) was formed on the entire surfaces of the luminescent layers 306, 307 and the transparent electrode 303 by means of the coating method.

Then, a blue luminescent layer 309 made of a distyryl derivative was formed on the hole injection and transfer layer 308 by means of the vacuum deposition method.

Finally, an Al—Li electrode 311 having the thickness of 0.8 μm was formed as the cathode by the deposition method, and thereby the organic EL element was manufactured. In this case, as described above, the cathode 311 was automatically separated and then insulated by the formation of the banks 304, the cathode was brought into a condition that is was patterned so as to correspond to the respective pixels 301, 302 and 303.

Example 5

First, in the same way as Example 1, ITO transparent electrodes 801, 802 and 803 and banks 805 were formed on a glass substrate 804 as shown in FIG. 4.

Then, after coating and pattern formation with the red, green and blue luminescent materials by discharging polymeric organic luminescent materials shown in Table 1 and Table 2, respectively, using the ink-jet device 809, they were undergone heat treatment under a nitrogen atmosphere at 150° C. for four hours to polymerize the precursors in the compositions of the materials, thereby forming luminescent layers 806 (red), 807 (green) and 808 (blue).

Next, the vacuum deposition was carried with the aluminum quinolynol complex to which the doping was not carried out to form the electron transfer layer 811 having the thickness of 0.1 μm.

Finally, an Al—Li electrode 812 having the thickness of 0.8 μm was formed as the cathode by the vacuum deposition, so that the organic EL element was manufactured.

Evaluation of the Luminescence Characteristics and the Film Characteristics of the Luminescent Layers The luminescence characteristics and the film characteristics of the luminescent layers of the organic EL elements which were manufactured in Examples 1 to 5 described above were evaluated according to the following methods.

1. Luminescence Starting Voltage

A prescribed voltage was applied to the element, and the applied voltage at which a luminance of 1 cd/m$^2$ is observed was defined as the luminescence starting voltage [Vth].

2. Luminescence Life

The initial luminance after applying a stabilization treatment was set to 100%, and the changes in the luminance of the EL element were measured when subjecting it to continuous luminescence through supply of a constant current of standard waveform, wherein the luminescence life is defined as the time until the luminance drops to 50% of the initial luminance.

In this case, the drive conditions for this experiment were set at 40° C. for room temperature, 23% for humidity and 20 mA/cm$^2$ for current density.

3. (Brightness)

The luminance was measured, in which the current was set to 20 mA/cm$^2$.

4. Wavelength at Maximum Absorption

The wavelength at maximum absorption for each luminescent layer was measured.

5. Stability in Film Formation

After heating the luminescent layer at 200° C. for 60 minutes, conditions for occurrence of defects such as cracks and deformation in the respective luminescent layers were observed by a microscope.

The results of the evaluation were classified according to the following marks.

⊚ . . . Extremely favorable
○ . . . Favorable
X . . . Unsatisfactory

The results of the evaluation are shown in Table 3 and Table 4.

As indicated in Table 3 and Table 4, the luminescent layers in Examples 1 to 5 have excellent luminescence characteristics and excellent film characteristics. In particular, when the luminescent layers were formed of polymer organic compounds, no defects were observed in the luminescent layers, and extremely favorable thin films were obtained.

In the above, the compositions for the organic EL elements and the manufacturing methods for the organic EL elements according to the present invention have been described according to the embodiments that are illustrated. However, the present invention is not limited to these embodiments, and for example, there may be inserted in the manufacturing processes for providing any intermediate functional layers between the respective layers. Further, the fluorescent dyes which are added for changing the luminescence characteristics are not limited to those described above.

Further, a layer made of, for example, 1,2,4-triazole derivative (TAZ) may be provided as a buffer layer between the respective layers, thereby enabling to more improve the luminance, luminescence life and the like.

Furthermore, the manufacturing method for the organic EL elements according to the present invention may include a further process in which surface treatment such as plasma, UV treatment, coupling or the like are applied to the surface of the resin resists, the pixel electrodes and the underlying layers in order to facilitate the sticking of the EL materials. Moreover, it is possible to apply the manufacturing method for the organic EL element of the present invention to the manufacturing method for the inorganic EL element.

The organic EL display device according to the present invention may be applied to the low information field, such as segment display and still image display of whole surface simultaneous luminescence, for example, display of pictures, characters, labels, or may be utilized as a light source having point, line, or surface shape.

INDUSTRIAL UTILIZATION

As described in the above, according to the manufacturing method of the organic EL element of the present invention, it is possible to explore rational design of the EL luminescent elements through a wide ranging selection of the luminescent materials. For example, through arbitrary combinations of the luminescent materials and fluorescent dyes, it is possible to obtain wide variety of display lights.

Further, by using the organic luminescent materials, it is possible to obtain the diversified designs of the EL element having high luminance and long life.

Furthermore, by carrying out the pattern forming and arrangement of the luminescent layer for at least one color, the hole injection and transfer layer and the electron injection and transfer layer by means of the ink-jet method, it is possible to set arbitrarily and precisely the size and the pattern of the luminescent elements.

When a precursor, which can be conjugated (form a film) by thermosetting is used as a luminescent material, the latitude in the setting of conditions such as viscosity can be expanded, and the adjustment of the conditions suitable as a discharge liquid for the ink-jet method can be facilitated.

Further, according to the manufacturing method for the organic EL element of the present invention, conditions such as the film thickness, the number of dots and the like can be adjusted arbitrarily, so that it is possible to control readily the luminescence characteristics of the luminescent layers.

Furthermore, according to the ink-jet method, it is possible to move freely the head on the transparent substrate, thereby enabling to form an element with an arbitrary size without restricting the dimensions of the substrate. Moreover, since required amounts of materials can be arranged at required locations, it is possible to maximally exclude the uselessness of waste liquid or the like. In this way, manufacturing of a full color display device with large screen size becomes possible at a low cost.

What is claimed is:

1. An organic EL apparatus comprising:
   a base;
   a plurality of first electrodes that are disposed on a first face of the base;
   a bank that is disposed on the first face;
   one first electrode of the plurality of first electrodes that has a first side edge and a second side edge that is opposite to the first side edge along a first direction; and
   another first electrode of the plurality of first electrodes that has a third side edge and a fourth side edge that is opposite to the third side edge along the first direction, wherein:
      the bank overlaps the first side edge, the second side edge, the third side edge and the fourth side edge;
      the one first electrode has a second face that is positioned between the first side edge and the second side edge and that is not overlapped by the bank;
      the another first electrode has a third face that is positioned between the third side edge and the fourth side edge and that is not overlapped by the bank;
      the second face and the third face are arranged along the first direction;
      a first distance between the first side edge and the second side edge is greater than a second distance between the second side edge and the third side edge;
      the bank continuously contacts the one first electrode and the another first electrode from a location proximate to the third side edge to a location proximate to the second side edge; and
      the bank includes an organic material selected from a group consisting of acrylic resin, epoxy resin and photosensitive polyimide.

2. The organic EL apparatus according to claim 1, wherein the bank acts as a light cut-off layer.

3. The organic EL apparatus according to claim 1, wherein the base is made of plastic.

4. The organic EL apparatus according to claim 1, further comprising an organic light emitting layer.

5. The organic EL apparatus according to claim 1, further comprising:
   a protective member over the first electrodes; and
   a seal for fixing between the base and the protective member;
   wherein the seal is disposed outside of an area where the bank is formed.

6. The organic EL apparatus according to claim 5, an inert gas being introduced between the first electrodes and the protective member.

7. The organic EL apparatus according to claim 6, the seal including a seal opening, the inert gas being introduced from the seal opening to a space between the second electrode and the protective member.

8. The organic EL apparatus according to claim 1, wherein the at least two adjacent identical electrodes are made of substantially the same material.

\* \* \* \* \*